(12) United States Patent
Kim et al.

(10) Patent No.: US 12,550,545 B2
(45) Date of Patent: Feb. 10, 2026

(54) DISPLAY APPARATUS AND METHOD OF MANUFACTURING THE SAME

(71) Applicant: Samsung Display Co., Ltd., Yongin-si (KR)

(72) Inventors: Deokhoi Kim, Yongin-si (KR); Jongbaek Seon, Yongin-si (KR); Jieun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 512 days.

(21) Appl. No.: 17/965,882

(22) Filed: Oct. 14, 2022

(65) Prior Publication Data

US 2023/0118680 A1 Apr. 20, 2023

(30) Foreign Application Priority Data

Oct. 15, 2021 (KR) .................. 10-2021-0137822

(51) Int. Cl.
*H10K 59/126* (2023.01)
*H10K 59/12* (2023.01)
*H10K 59/122* (2023.01)
*H10K 71/00* (2023.01)

(52) U.S. Cl.
CPC ......... *H10K 59/126* (2023.02); *H10K 59/122* (2023.02); *H10K 59/1201* (2023.02); *H10K 71/00* (2023.02)

(58) Field of Classification Search
None
See application file for complete search history.

(56) References Cited

U.S. PATENT DOCUMENTS

| | | | | |
|---|---|---|---|---|
| 4,644,638 A | * | 2/1987 | Switzer | H10F 10/164 |
| | | | | 205/91 |
| 10,991,776 B2 | | 4/2021 | Kim et al. | |
| 2021/0167025 A1 | | 6/2021 | Zhang et al. | |
| 2022/0005903 A1 | * | 1/2022 | Kim | H10K 59/8731 |
| 2023/0292563 A1 | * | 9/2023 | Park | H10K 59/873 |
| 2024/0074246 A1 | * | 2/2024 | Choi | H10K 59/121 |
| 2024/0220051 A1 | * | 7/2024 | Han | G06F 3/0443 |

FOREIGN PATENT DOCUMENTS

| | | | | |
|---|---|---|---|---|
| CN | 110911466 | | 3/2020 | |
| CN | 111710791 | | 9/2020 | |
| CN | 116670749 A | * | 8/2023 | ........... G09G 3/3266 |
| CN | 117729806 A | * | 3/2024 | ........... H10K 59/131 |
| CN | 117998930 A | * | 5/2024 | ........... H10K 50/844 |
| EP | 4322728 A1 | * | 2/2024 | ........... G06F 1/1616 |
| KR | 10-2008-0014328 | | 2/2008 | |
| KR | 10-2020-0042996 A | | 4/2020 | |
| WO | WO-2022188168 A1 | * | 9/2022 | |

* cited by examiner

*Primary Examiner* — Michael Lebentritt
(74) *Attorney, Agent, or Firm* — Innovation Counsel LLP

(57) ABSTRACT

Provided are a display apparatus having improved display quality, and a method of manufacturing the display apparatus. The display apparatus includes a pixel circuit layer arranged on a substrate, and a display element layer arranged on the pixel circuit layer. The display element layer includes a display element including a pixel electrode, an intermediate layer arranged on the pixel electrode, and an opposite electrode, a pixel-defining layer having an opening that exposes a portion of the pixel electrode, a spacer arranged on the pixel-defining layer, and a conductive pattern arranged on the spacer.

20 Claims, 22 Drawing Sheets

DISPLAY APPARATUS AND METHOD OF MANUFACTURING THE SAME

CROSS-REFERENCE TO RELATED APPLICATION(S)

This application claims priority to and benefits of Korean Patent Application No. 10-2021-0137822 under 35 U.S.C. § 119, filed on Oct. 15, 2021 in the Korean Intellectual Property Office, the disclosure of which is incorporated by reference herein in its entirety.

BACKGROUND

1. Technical Field

The disclosure relates to a display apparatus and a method of manufacturing the display apparatus having improved display quality.

2. Description of the Related Art

Among display apparatuses, an organic light-emitting display apparatus has a wide viewing angle, superior contrast, and fast response speed, and thus has been attracting attention as a next-generation display apparatus.

In general, an organic light-emitting display apparatus operates may operate by forming a thin-film transistor and organic light-emitting elements on a substrate, and emitting light by the organic light-emitting elements themselves. Such an organic light-emitting display apparatus may be used as a display unit of a small product such as a mobile phone, or as a display unit of a large product such as a television.

The organic light-emitting display apparatus generally includes an organic light-emitting element having an intermediate layer including an emission layer between a pixel electrode and an opposite electrode as each pixel. In such an organic light-emitting display apparatus, in general, whether or not each pixel emits light or the degree of emission by each pixel may be controlled by a thin-film transistor electrically connected to a pixel electrode, and an opposite electrode may be integral to multiple pixels.

SUMMARY

However, in a related-art display apparatus, due to static electricity generated during a manufacturing process, fixed charges may be charged in some pixels, thereby deteriorating display quality.

One or more embodiments may include a display apparatus having improved display quality by suppressing the generation of static electricity during the manufacturing process, and a method of manufacturing the display apparatus. However, this objective is an example and does not limit the scope of the disclosure.

Additional aspects will be set forth in part in the description that follows and, in part, will be apparent from the description, or may be learned by practice of the embodiments of the disclosure.

According to an embodiment, a display apparatus may include a pixel circuit layer arranged on a substrate, and a display element layer arranged on the pixel circuit layer, wherein the display element layer may include a display element including a pixel electrode, an intermediate layer arranged on the pixel electrode, and an opposite electrode, a pixel-defining layer having an opening that exposes a portion of the pixel electrode, a spacer arranged on the pixel-defining layer, and a conductive pattern arranged on the spacer.

The conductive pattern may include doping material selected from a group consisting of a halogen element, a chalcogen element, and a combination thereof.

The doping material may include boron (B), fluorine (F), phosphorus (P), or a combination thereof.

A concentration distribution of the doping material may change along a first direction perpendicular to the substrate.

The display apparatus may further include an inorganic layer disposed between the conductive pattern and the intermediate layer.

The display apparatus may further include a coating layer disposed on the inorganic layer. The coating layer may include at least one element selected from a group consisting of a halogen element, a chalcogen element, and a combination thereof.

The display apparatus may further include a coating layer disposed between the spacer and the inorganic layer. The coating layer may include at least one element selected from a group consisting of a halogen element, a chalcogen element, and a combination thereof.

The conductive pattern may overlap at least a partial area of the spacer and at least a partial area of the pixel-defining layer.

The conductive pattern may include a metal material and may overlap an upper surface of the spacer.

According to an embodiment, a method of manufacturing a display apparatus may include forming a pixel circuit layer on a substrate, forming a pixel electrode on the pixel circuit layer, forming a pixel-defining layer having an opening that exposes a portion of the pixel electrode, forming a spacer on the pixel electrode, forming a conductive pattern by doping the spacer, and sequentially forming an intermediate layer and an opposite electrode on the spacer.

The forming of the conductive pattern may include injecting, into the spacer, doping material selected from a group consisting of a halogen element, a chalcogen element, and a combination thereof.

The doping material may include boron (B), fluorine (F), phosphorus (P), or a combination thereof.

A concentration distribution of the doping material may change along a first direction perpendicular to the substrate.

The forming of the conductive pattern may include forming an inorganic layer on at least a partial area of the spacer and at least a partial area of the pixel-defining layer.

The forming of the conductive pattern may include injecting the doping material through the inorganic layer.

The forming of the conductive pattern may include forming a coating layer on the spacer before the forming of the inorganic layer, and the coating layer may include a doping material.

The forming of the conductive pattern may include forming a coating layer on the inorganic layer, and the coating layer may include a doping material.

The conductive pattern may overlap at least a partial area of the spacer and at least a partial area of the pixel-defining layer.

According to an embodiment, a method of manufacturing a display apparatus may include forming a pixel circuit layer on a substrate, forming a pixel electrode on the pixel circuit layer, forming a pixel-defining layer having an opening that exposes a portion of the pixel electrode, forming a spacer on the pixel electrode, forming a conductive pattern that overlaps an upper surface of the spacer, and sequentially forming an intermediate layer and an opposite electrode on the spacer.

The conductive pattern may include a metal material.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
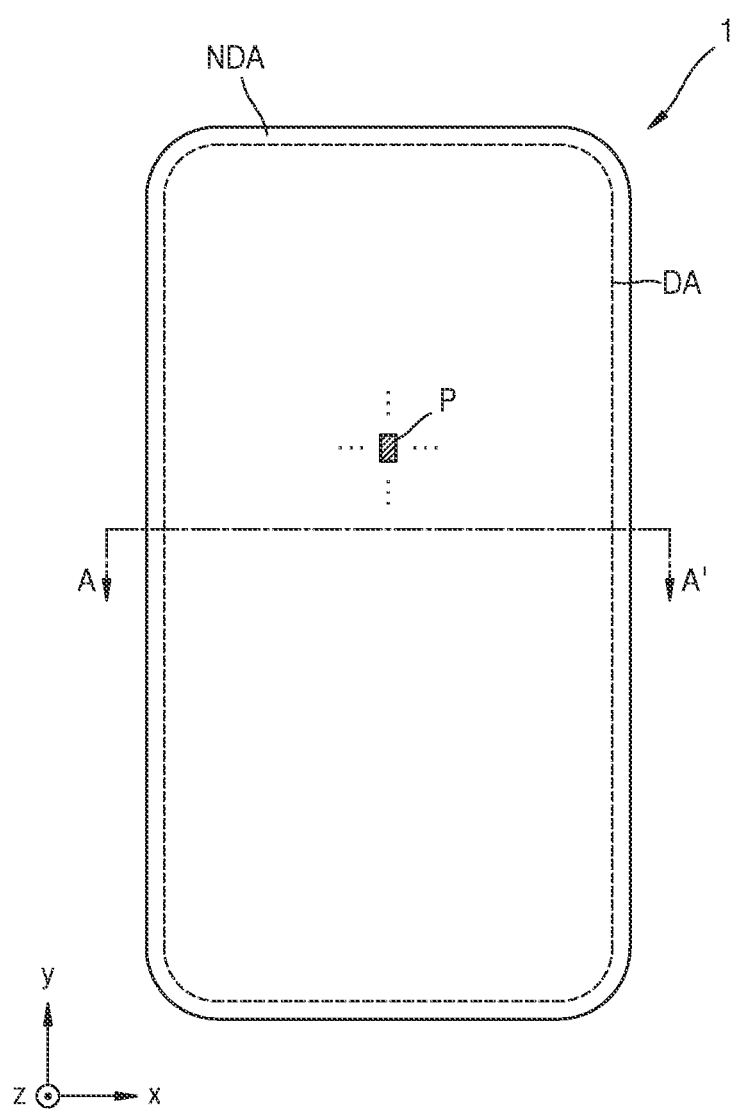
FIG. 1 is a plan view schematically illustrating a display apparatus according to an embodiment.

Reference will now be made in detail to embodiments, examples of which are illustrated in the accompanying drawings, wherein like reference numerals refer to like elements throughout the disclosure. In this regard, the embodiments of the disclosure may have different forms and should not be construed as being limited to the descriptions set forth herein. Accordingly, the embodiments are merely described below, by referring to the figures, to explain aspects of the description of the disclosure. As used herein, the term "and/or" may include any and all combinations of one or more of the associated listed items. Throughout the disclosure, the expression "at least one of a, b or c" may indicate only a, only b, only c, both a and b, both a and c, both b and c, all of a, b, and c, or any variations thereof.

The disclosure may, however, be embodied in many different forms and should not be construed as being limited to the embodiments set forth herein. Effects and features of the disclosure, and methods for achieving the same will be clarified with reference to embodiments described below in detail with reference to the drawings. However, the embodiments of the disclosure may be implemented in various forms, not by being limited to the embodiments presented below.

Hereinafter, embodiments will be described with reference to the accompanying drawings, wherein like reference symbols refer to like elements throughout the disclosure, and redundant descriptions thereof are omitted.

Although the terms "first," "second," etc. may be used to describe various elements, these elements should not be limited by these terms. These terms are only used to distinguish one element from another element.

In the specification, an expression used in the singular may encompass the expression of the plural, unless it has a clearly different meaning in the context.

It will be understood that the terms "comprise," "comprising," "include" and/or "including" as used herein may specify the presence of stated features or components but do not preclude the addition of one or more other features or components.

It will be further understood that, in case that a layer, area, or component is referred to as being "on" another layer, area, or component, it may be directly or indirectly on the other layer, area, or component. For example, intervening layers, areas, or components may be present.

It will be understood that in case that a layer, region, or element is referred to as being "connected," the layer, the region, or the element may be directly connected or may be indirectly connected with intervening layers, regions, or elements therebetween. For example, in case that a layer, a region, or an element is electrically connected, the layer, the region, or the element may be directly electrically connected or may be indirectly electrically connected with intervening layers, regions, or elements therebetween.

In the specification, "A and/or B" means A or B, or A and B. "At least one of A and B" means A, B, or A and B.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In case that an embodiment may be implemented differently, a certain process order may be performed differently from the described order. For example, two processes described in succession may be performed substantially simultaneously, or may be performed in an order opposite to that described.

In the drawings, sizes of components in the drawings may be exaggerated or reduced for convenience of explanation. In other words, because sizes and thicknesses of components in the drawings are arbitrarily illustrated for convenience of description, the following embodiments may not be limited thereto.

FIG. 1 is a plan view schematically illustrating a display apparatus 1 according to an embodiment.

Referring to FIG. 1, the display apparatus 1 may include a display area DA and a peripheral area NDA outside the display area DA. Multiple pixels P including a display element may be arranged in the display area DA, and the display apparatus 1 may provide an image using light emitted from the multiple pixels PX arranged in the display area DA. The peripheral area NDA may include a type of non-display area in which display elements are not arranged, and the display area DA may be surrounded by the peripheral area NDA.

Although FIG. 1 shows a display apparatus 1 having a flat display surface, the disclosure is not limited thereto. In an embodiment, the display apparatus 1 may include a three-dimensional display surface or a curved display surface.

In case that the display apparatus 1 includes a three-dimensional display surface, the display apparatus 1 may include multiple display areas pointing in different directions, and may include, for example, a polygonal columnar display surface. In another embodiment, in case that the display apparatus 1 includes a curved display surface, the display apparatus 1 may be implemented in various forms, such as a flexible, foldable, or rollable display apparatus.

As an embodiment, FIG. 1 shows a display apparatus 1 applicable to a mobile phone terminal. Although not shown, electronic modules, camera modules, power modules, etc. mounted on a main board may be arranged together with the display apparatus 1 on a bracket/case, etc., thereby configuring a mobile phone terminal. The display apparatus 1 according to one or more embodiments may be applied to large electronic apparatuses such as televisions and monitors, as well as small and medium-sized electronic apparatuses such as tablets, car navigation systems, game consoles, and smart watches.

Although FIG. 1 shows a case in which the display area DA of the display apparatus 1 has a quadrangle with round corners, in another embodiment, a shape of the display area DA may include a circle, an ellipse, or a polygon such as a triangle or a pentagon.

Hereinafter, an organic light-emitting display apparatus is described as an embodiment of the display apparatus 1 according to an embodiment, but the display apparatus 1 of the disclosure is not limited thereto. In another embodiment, the display apparatus 1 of the disclosure may be an inorganic light-emitting display apparatus (or an inorganic electroluminescent (EL) display apparatus) or a display apparatus such as a quantum dot light-emitting display apparatus. For example, an emission layer of a display element included in the display apparatus 1 may include an organic material, an inorganic material, quantum dots, an organic material and quantum dots, or an inorganic material and quantum dots.

Figure 2:
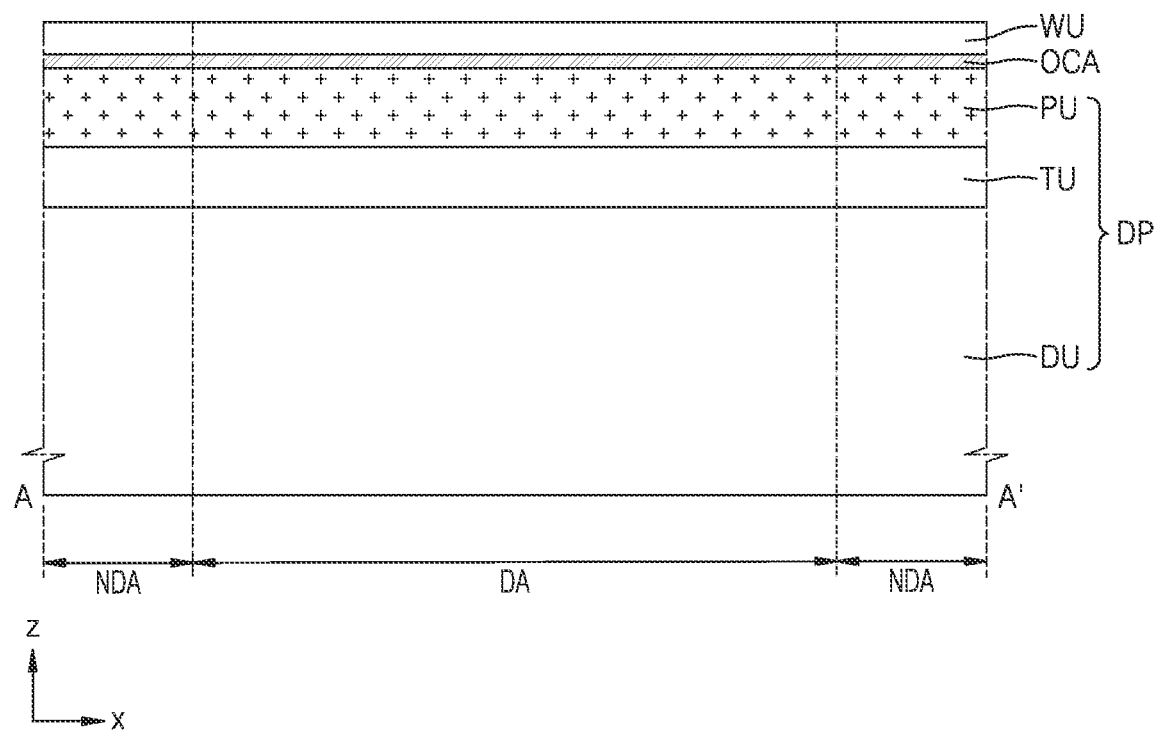
FIG. 2 is a schematic cross-sectional view schematically illustrating a cross-section of the display apparatus in FIG. 1, taken along line A-A' in FIG. 1.

FIG. 2 is a schematic cross-sectional view schematically illustrating a cross-section of the display apparatus 1 in FIG. 1, taken along line A-A' in FIG. 1.

The display apparatus 1 according to an embodiment may include a display layer DU, an input sensing layer TU, an anti-reflection layer PU, and a window layer WU. At least some elements of the display layer DU, the input sensing layer TU, the anti-reflection layer PU, and the window layer WU may be formed by a continuous process, or at least some elements may be coupled to each other by an adhesive member. In FIG. 2, an optically transparent adhesive member OCA is shown as an adhesive member as an embodiment. An adhesive member described below may include a related-art adhesive. In an embodiment, the window layer WU may be replaced with another configuration or may be omitted.

In an embodiment, the input sensing layer TU may be directly arranged on the display layer DU. In the specification, "the configuration of B is directly arranged on the configuration of A" means that a separate adhesive layer/adhesive member is not arranged between the configuration of A and the configuration of B. The configuration of B may be formed by a continuous process on a base surface provided by the configuration of A after the configuration of A is formed.

A display panel DP may include the display layer DU, the input sensing layer TU directly arranged on the display layer DU, and the anti-reflection layer PU. An optically transparent adhesive member OCA may be arranged between the display panel DP and the window layer WU.

The display layer DU may generate an image, and the input sensing layer TU may obtain coordinate information of an external input (e.g. a touch event). Although not shown separately, the display panel DP according to an embodiment may include a protection member on a lower surface of the display layer DU. The protection member and the display layer DU may be coupled to each other by an adhesive member.

In an embodiment, the display panel DP may further include an optical function layer (not shown) on the input sensing layer TU. The optical function layer may improve light efficiency. The optical function layer may improve, for example, the front luminance efficiency and/or side visibility of light emitted by a display element OLED.

The anti-reflection layer PU may reduce a reflectance of external light incident from an upper side of the window layer WU. For example, the anti-reflection layer PU may absorb at least a partial wavelength area of the incident external light.

Figure 3A:
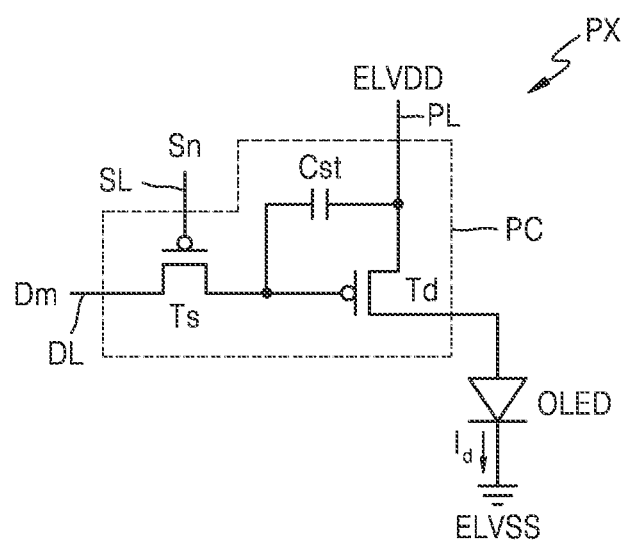
FIGS. 3A and 3B are equivalent schematic circuit diagrams schematically illustrating pixels applicable to display apparatuses, according to embodiments.
Figure 3B:
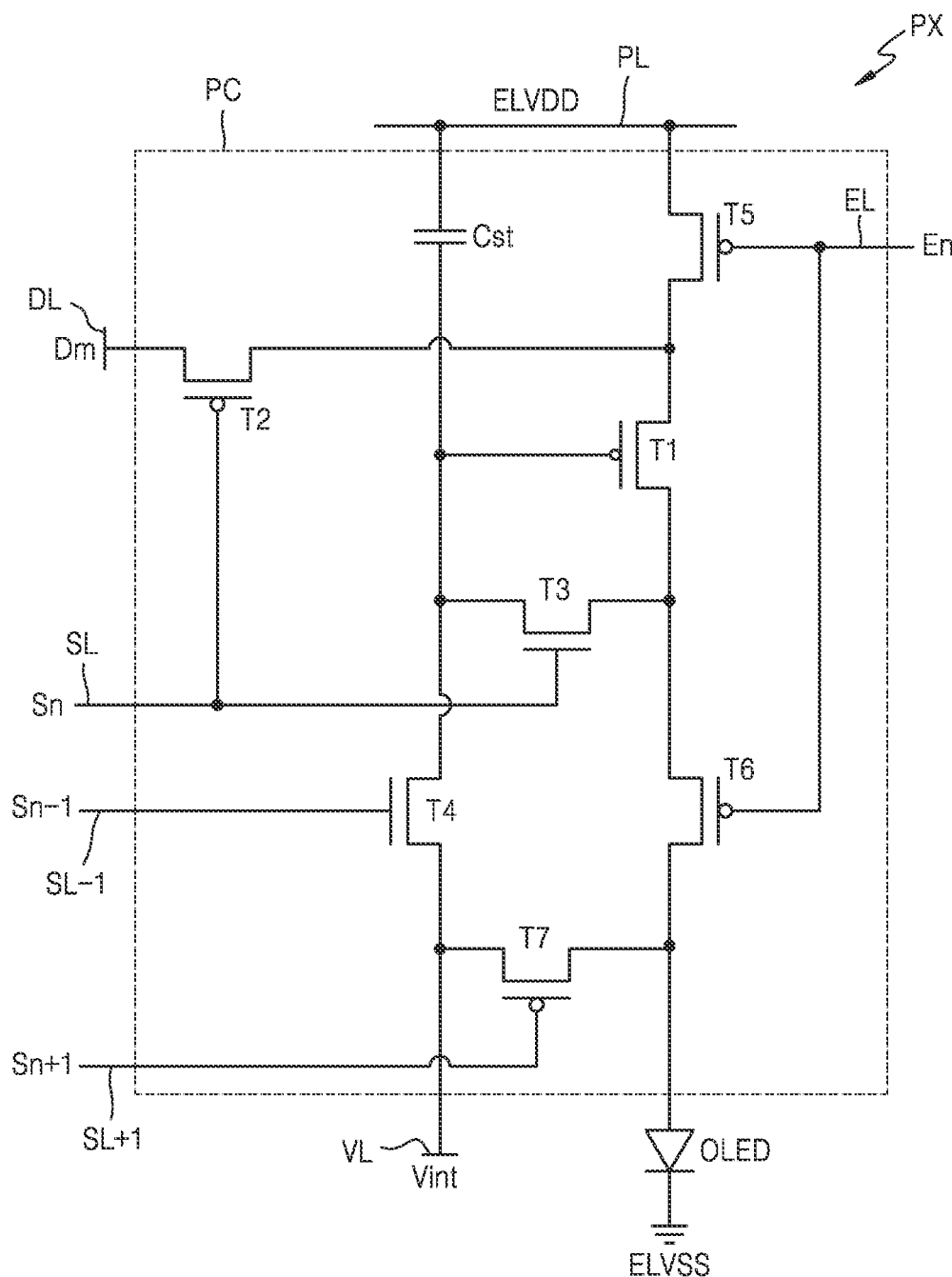

FIGS. 3A and 3B are equivalent schematic circuit diagrams schematically illustrating a pixel PX applicable to a display apparatus, according to embodiments.

Referring to FIGS. 3A and 3B, the pixel PX may include a pixel circuit PC and a display element electrically connected to the pixel circuit PC, for example, an organic light-emitting diode OLED.

Referring to FIG. 3A, in an embodiment, the pixel circuit PC may include a driving thin-film transistor Td, a switching thin-film transistor Ts, and a storage capacitor Cst. For example, each pixel PX may emit one of red, green, and blue light, or one of red, green, blue, and white light by the organic light-emitting diode OLED.

The switching thin-film transistor Ts may be electrically connected to a scan line SL and a data line DL and may transfer, to the driving thin-film transistor Td, a data signal or data voltage received via the data line DL based on a scan signal or switching voltage received via the scan line SL. The storage capacitor Cst may be electrically connected to the switching thin-film transistor Ts and a driving voltage line PL and may store a voltage corresponding to a voltage difference between a voltage received from the switching thin-film transistor Ts and a first power voltage ELVDD applied to the driving voltage line PL.

The driving thin-film transistor Td may be electrically connected to the driving voltage line PL and the storage capacitor Cst and may control a driving current flowing from the driving voltage line PL to the organic light-emitting diode OLED according to the voltage stored in the storage capacitor Cst. The organic light-emitting diode OLED may emit light having a luminance according to a driving current. An opposite electrode (e.g., a cathode) of the organic light-emitting diode OLED may receive a second power voltage ELVSS.

Referring to FIG. 3B, in an embodiment, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

FIG. 3B shows a case in which a first scan line SL, a second scan line, a previous scan line SL−1, a next scan line SL+1, an emission control line EL, the data line DL, an initialization voltage line VL, and the driving voltage line PL are provided for each pixel circuit PC. However, in another embodiment, at least one of the first scan line SL, the second scan line SL−1, the next scan line SL+1, the emission control line EL, and the data line DL, and the initialization voltage line VL may be shared by neighboring pixel circuits.

Some of the multiple thin-film transistors may be provided as n-channel metal-oxide-semiconductor field-effect transistors (MOSFETs) (NMOS), and the rest may be provided as p-channel MOSFETs (PMOS). In an embodiment, among the multiple thin-film transistors, the compensation thin-film transistor T3 and the first initialization thin-film transistor T4 may be provided as an NMOS, and the rest may be provided as a PMOS. In another embodiment, among the multiple thin-film transistors, the compensation thin-film transistor T3, the first initialization thin-film transistor T4, and the second initialization thin-film transistor T7 may be provided as an NMOS, and the rest may be provided as a PMOS. In some embodiments, only one of the multiple thin-film transistors may be provided as an NMOS, and the rest may be provided as a PMOS. In some embodiments, all of the multiple thin-film transistors may be provided as an NMOS.

The signal lines may include the first scan line SL configured to transmit a first scan signal Sn, and the previous scan line SL−1 configured to transmit a previous scan signal Sn−1 to the first initialization thin-film transistor T4, the emission control line EL configured to transmit an emission control signal En to the operation control thin-film transistor T5 and the emission control thin-film transistor T6, the next scan line SL+1 configured to transmit a next scan signal Sn+1, and the data line DL which crosses the first scan line SL and transfers a data signal Dm.

The driving voltage line PL may be configured to transmit the first power voltage ELVDD through the driving voltage line PL, and the initialization voltage line VL may be configured to transmit an initialization voltage Vint for initializing the driving thin-film transistor T1 and a pixel electrode.

A gate electrode of the driving thin-film transistor T1 may be electrically connected to the storage capacitor Cst. A source electrode of the driving thin-film transistor T1 may be electrically connected to the driving voltage line PL via the operation control thin-film transistor T5. A drain electrode of the driving thin-film transistor T1 may be electrically connected to the organic light-emitting diode OLED via the emission control thin-film transistor T6. The driving thin-film transistor T1 may receive the data signal Dm according to a switching operation of the switching thin-film transistor T2 and may supply a driving current to the organic light-emitting diode OLED.

A gate electrode of the switching thin-film transistor T2 may be electrically connected to the first scan line SL, and a source electrode of the switching thin-film transistor T2 may be electrically connected to the data line DL. A drain electrode of the switching thin-film transistor T2 may be electrically connected to the driving voltage line PL via the operation control thin-film transistor T5 and also electrically connected to the source electrode of the driving thin-film transistor T1. The switching thin-film transistor T2 may be turned on according to the first scan signal Sn received via the first scan line SL, and may perform a switching operation of transmitting the data signal Dm received via the data line DL to the source electrode of the driving thin-film transistor T1.

A gate electrode of the compensation thin-film transistor T3 may be electrically connected to the first scan line SL. A source electrode of the compensation thin-film transistor T3 may be electrically connected to the drain electrode of the driving thin-film transistor T1 and electrically connected to the pixel electrode of the organic light-emitting diode OLED via the emission control thin-film transistor T6. A drain electrode of the compensation thin-film transistor T3 may be electrically connected together with any electrode of the storage capacitor Cst, a source electrode of the first initialization thin-film transistor T4, and the gate electrode of the driving thin-film transistor T1. The compensation thin-film transistor T3 may be turned on according to the first scan signal Sn received via the first scan line SL to connect the gate electrode and the drain electrode of the driving thin-film transistor T1 to each other, thereby diode-connecting the driving thin-film transistor T1.

A gate electrode of the first initialization thin-film transistor T4 may be electrically connected to the previous scan line SL−1. A drain electrode of the first initialization thin-film transistor T4 may be electrically connected to the initialization voltage line VL. A source electrode of the first initialization thin-film transistor T4 may be electrically connected together with any electrode of the storage capacitor Cst, the drain electrode of the compensation thin-film transistor T3, and the gate electrode of the driving thin-film transistor T1. The first initialization thin-film transistor T4 may be turned on according to the previous scan signal Sn−1 received via the previous scan line SL−1, and may perform an initialization operation of initializing a voltage of the gate electrode of the driving thin-film transistor T1 by transmitting the initialization voltage Vint to the gate electrode of the driving thin-film transistor T1.

A gate electrode of the operation control thin-film transistor T5 may be electrically connected to the emission control line EL. A source electrode of the operation control thin-film transistor T5 may be electrically connected to the driving voltage line PL. A drain electrode of the operation control thin-film transistor T5 may be electrically connected to the source electrode of the driving thin-film transistor T1 and the drain electrode of the switching thin-film transistor T2.

A gate electrode of the emission control thin-film transistor T6 may be electrically connected to the emission control line EL. A source electrode of the emission control thin-film transistor T6 may be electrically connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be simultaneously turned on according to the emission control signal En received via the emission control line EL, so that the first power voltage ELVDD may be transmitted to the organic light-emitting diode OLED, and a driving current may flow through the organic light-emitting diode OLED.

A gate electrode of the second initialization thin-film transistor T7 may be electrically connected to the next scan line SL+1. A source electrode of the second initialization thin-film transistor T7 may be electrically connected to the pixel electrode of the organic light-emitting diode OLED. A drain electrode of the second initialization thin-film transistor T7 may be electrically connected to the initialization voltage line VL. The second initialization thin-film transistor T7 may be turned on according to the next scan signal Sn+1 received via the next scan line SL+1 to initialize the pixel electrode of the organic light-emitting diode OLED.

In FIG. 3B, the first initialization thin-film transistor T4 and the second initialization thin-film transistor T7 may be respectively electrically connected to the previous scan line SL−1 and the next scan line SL+1. However, in another embodiment, both of the first initialization thin-film transistor T4 and the second initialization thin-film transistor T7 may be electrically connected to the previous scan line SL−1 to be driven according to the previous scan signal Sn−1.

Another electrode of the storage capacitor Cst may be electrically connected to the driving voltage line PL. Any electrode of the storage capacitor Cst may be electrically connected together to the gate electrode of the driving thin-film transistor T1, the drain electrode of the compensation thin-film transistor T3, and the source electrode of the first initialization thin-film transistor T4.

In some embodiments, the pixel circuit PC may include a boost capacitor (not shown). Any electrode of the boost capacitor may be electrically connected to the gate electrode of the switching thin-film transistor T2 and the first scan line SL. Another electrode of the boost capacitor may be electrically connected to the source electrode of the compensation thin-film transistor T3.

The opposite electrode (e.g., a cathode) of the organic light-emitting diode OLED may receive the second power voltage ELVSS. The organic light-emitting diode OLED may receive a driving current from the driving thin-film transistor T1 to emit light.

The numbers of thin-film transistors and storage capacitors in the pixel circuit PC and the circuit design thereof are not limited to those described with reference to FIGS. 3A and 3B, and the numbers thereof and the circuit design thereof may be variously changed.

In an embodiment, the multiple thin-film transistors may include silicon-based thin-film transistors including a silicon semiconductor. In another embodiment, at least one of the multiple thin-film transistors may include an oxide-based thin-film transistor including an oxide semiconductor, and the rest may include a silicon-based thin-film transistor including a silicon semiconductor.

In an embodiment, the driving thin-film transistor T1 may include a silicon-based thin-film transistor including a silicon semiconductor layer including polycrystalline silicon having high reliability, thereby realizing a high-resolution display apparatus.

Because the oxide semiconductor has high carrier mobility and low leakage current, a voltage drop may not be large even in case that a driving time is long. In other words, because a color change of an image according to the voltage drop may not be large even during low-frequency driving, low-frequency driving may be possible. As described above, because the oxide semiconductor has low leakage current, at least one of the compensation thin-film transistor T3 and the first initialization thin-film transistor T4 electrically connected to the gate electrode of the driving thin-film transistor T1 may include the oxide semiconductor to prevent leakage current that may flow to the gate electrode of the driving thin-film transistor T1 and reduce power consumption.

Figure 4:
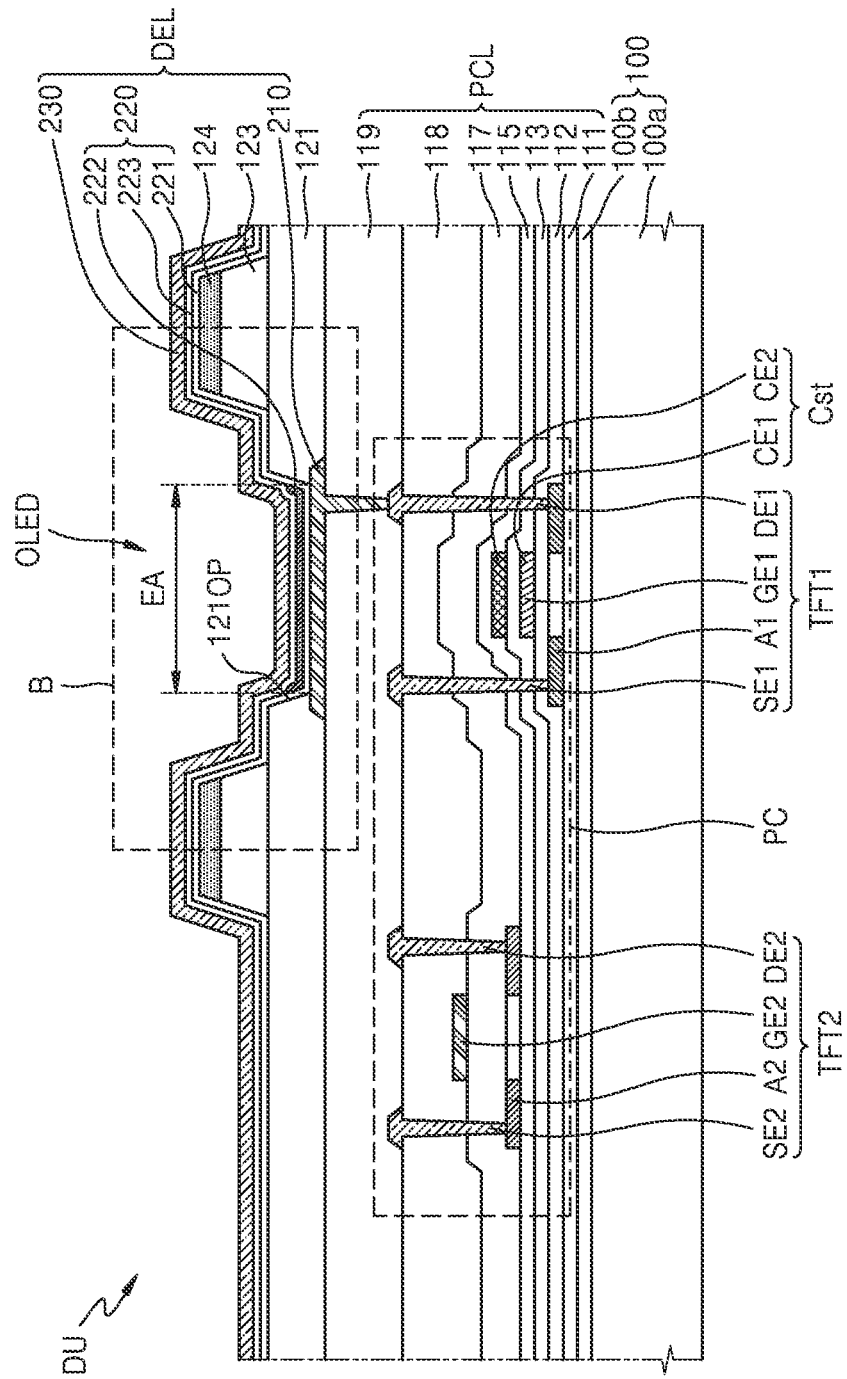
FIGS. 4 and 5 are schematic cross-sectional views schematically illustrating a portion of a display panel according to embodiments.
Figure 5:
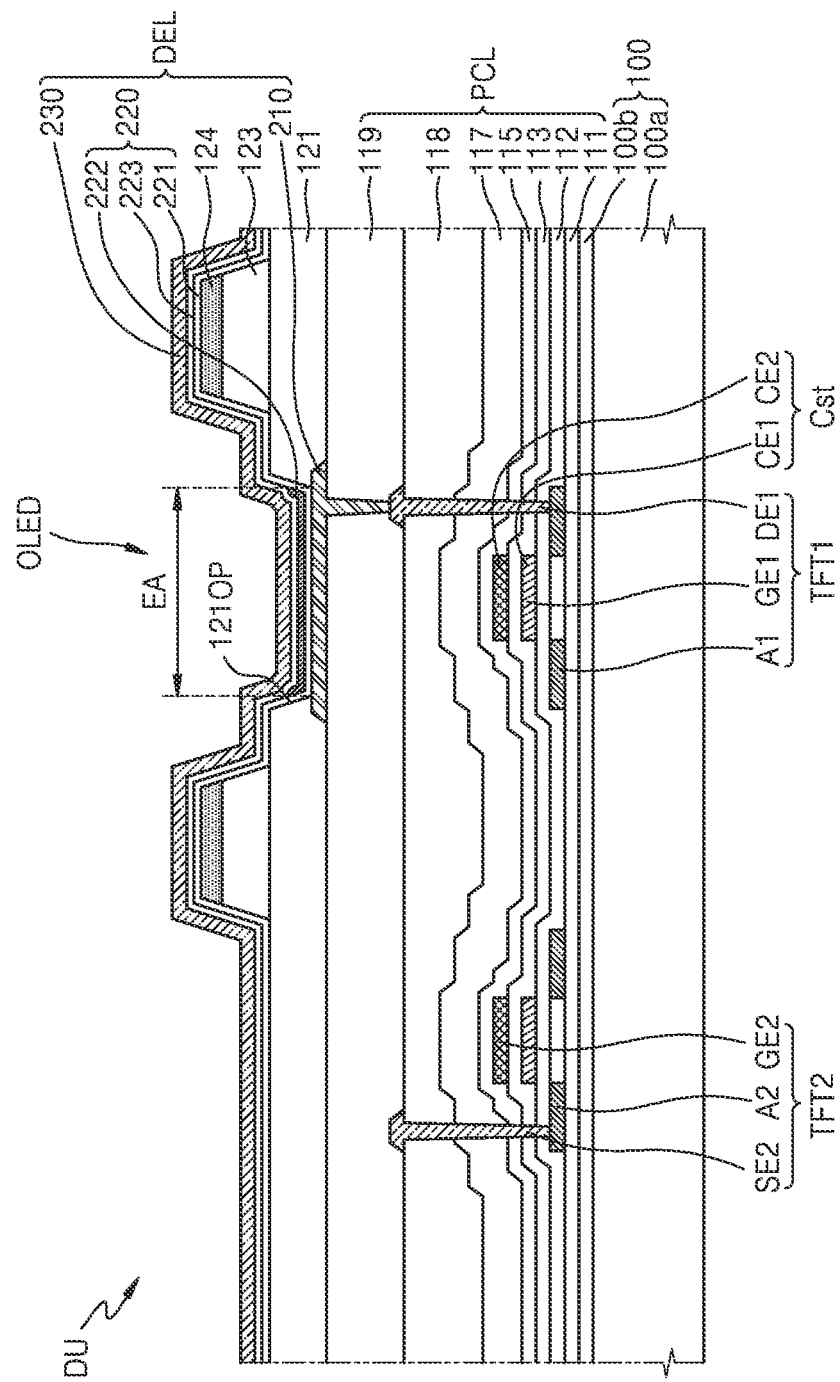

FIGS. 4 and 5 are cross-sectional views schematically illustrating a portion of a display apparatus according to embodiments.

In FIGS. 4 and 5, the input sensing layer TU, the anti-reflection layer PU, and the window layer WU are omitted for convenience of explanation, and the display layer DU is described in detail.

Referring to FIG. 4, the display layer DU may include a substrate 100, a pixel circuit layer PCL arranged on the substrate 100, and a display element layer DEL arranged on the pixel circuit layer PCL.

The substrate 100 may include a material such as glass material, metal, or organic material. According to an embodiment, the substrate 100 may include a flexible material. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a multi-layer structure including an organic layer 100a including the polymer resin and a barrier layer 100b arranged on the organic layer 100a. The barrier layer 100b may include an inorganic material (such as silicon oxide, silicon nitride, silicon oxynitride, and amorphous silicon), and various modifications may be made. In some embodiments, the substrate 100 may include two organic layers and an inorganic barrier layer positioned between the organic layers.

A buffer layer 111 may be arranged on the substrate 100. The buffer layer 111 may prevent impurities from entering various elements arranged on the substrate 100 through the substrate 100.

The pixel circuit layer PCL including a first thin-film transistor TFT1, a second thin-film transistor TFT2, and the storage capacitor Cst may be arranged on the buffer layer 111. The first thin-film transistor TFT1 may include a first semiconductor layer A1, a first gate electrode GE1 overlapping a channel area of the first semiconductor layer A1, and a first source electrode SE1 and a first drain electrode DE1 respectively electrically connected to a source area and a drain area of the first semiconductor layer A1.

A gate insulating layer 112 may be arranged between the first semiconductor layer A1 and the first gate electrode GE1, and a first insulating layer 113, a second insulating layer 115, a third insulating layer 117, and a fourth insulating layer 118 may be arranged between the first gate electrode GE1, the first source electrode SE1, and the first drain electrode DE1.

The second thin-film transistor TFT2 may include a second semiconductor layer A2, a second gate electrode GE2 overlapping a channel area of the second semiconductor layer A2, and a second source electrode SE2 and a second drain electrode DE2 respectively electrically connected to a source area and a drain area of the second semiconductor layer A2. In some embodiments, at least one of the second source electrode SE2 and the second drain electrode DE2 may be replaced with a different configuration. The third insulating layer 117 may be arranged between the second semiconductor layer A2 and the second gate electrode GE2, and the fourth insulating layer 118 may be arranged between the second gate electrode GE2 and the second source electrode SE2 and the second drain electrode DE2.

The storage capacitor Cst may be arranged to overlap the first thin-film transistor TFT1. The storage capacitor Cst may include a first capacitor plate CE1 and a second capacitor plate CE2 overlapping each other. In an embodiment, the first gate electrode GE1 of the first thin-film transistor TFT1 may be integrally provided as a single body with the first capacitor plate CE1 of the storage capacitor Cst. In some embodiments, the storage capacitor Cst may not overlap the first thin-film transistor TFT1, and the first insulating layer 113 may be arranged between the first capacitor plate CE1 and the second capacitor plate CE2.

The first semiconductor layer A1 may include a channel area, and a source area and a drain area doped with a large amount of impurities. In an embodiment, the first semiconductor layer A1 may include a silicon semiconductor material. In an embodiment, the first semiconductor layer A1 may include polysilicon or amorphous silicon. In an embodiment, the first semiconductor layer A1 may include an oxide semiconductor material.

The second semiconductor layer A2 may include a channel area, and a source area and a drain area doped with a large amount of impurities. The second semiconductor layer A2 may include an oxide semiconductor. For example, the second semiconductor layer A2 may include a zinc (Zn) oxide-based material, such as Zn oxide, indium (In)—Zn oxide, gallium (Ga)—In—Zn oxide, or the like. In some embodiments, the second semiconductor layer A2 may include an In—Ga—Zn—O (IGZO), In—Sn—Zn—O (ITZO), or In—Ga—Sn—Zn—O (IGTZO) semiconductor in which a metal such as indium (In), gallium (Ga), or tin (Sn) is contained in zinc oxide (ZnO). In an embodiment, the second semiconductor layer A2 may include a silicon semiconductor material or may include an organic semiconductor.

Because the oxide semiconductor has high carrier mobility and low leakage current, a voltage drop may not be large even in case that a driving time is long. In other words, because a color change of an image according to the voltage drop is not large even during low-frequency driving, low-frequency driving may be possible. As described above, because the oxide semiconductor may have an advantage of a low leakage current, the oxide semiconductor may be employed in at least one of the thin-film transistors other than the driving thin-film transistor to prevent leakage current and reduce power consumption.

In an embodiment, as shown in FIG. 5, the first semiconductor layer A1 of the first thin-film transistor TFT1 and the second semiconductor layer A2 of the second thin-film transistor TFT2 may be arranged on the same layer. For example, the first semiconductor layer A1 and the second semiconductor layer A2 may be arranged on the buffer layer 111, and in some embodiments, the first semiconductor layer A1 and the second semiconductor layer A2 may be integrally provided as a single body. For example, the source area and the drain area of the first semiconductor layer A1 may be used as the drain area and the source area of the second semiconductor layer A2.

In an embodiment, the first semiconductor layer A1 and/or the second semiconductor layer A2 may include a silicon semiconductor material. In an embodiment, the first semiconductor layer A1 and/or the second semiconductor layer A2 may include polysilicon or amorphous silicon. In another embodiment, the first semiconductor layer A1 and/or the second semiconductor layer A2 may include an oxide semiconductor material.

The gate insulating layer 112 may include an inorganic insulating material such as silicon oxide ($SiO_x$), silicon oxynitride (SiON), or silicon nitride ($SiN_x$), and may have a single-layer or multi-layer structure including the above-described materials.

The first and second gate electrodes GE1 and GE2 or the first capacitor plate CE1 may include a low-resistance conductive material such as molybdenum (Mo), aluminum (Al), copper (Cu), and/or titanium (Ti), and may have a single-layer or multi-layer structure including the above-described materials.

The first insulating layer 113, the second insulating layer 115, and the third insulating layer 117, and the fourth insulating layer 118 may include an inorganic insulating material such as $SiO_x$, SiON, and $SiN_x$, and may have a single-layer or multi-layer structure including the above-described materials.

The second capacitor plate CE2 may include Al, chromium (Cr), Mo, Ti, tungsten (W), and/or Cu, and may have a single-layer or multi-layer structure including the above-described materials.

The first source electrode SE1, the first drain electrode DE1, the second source electrode SE2, and the second drain electrode DE2 may include, Al, Mo, Ti, W, and/or Cu, and may have a single-layer or multi-layer structure including the above-described materials. For example, each of the first source electrode SE1, the first drain electrode DE1, the second source electrode SE2, and the second drain electrode DE2 may have a three-layer structure of a Ti layer, an Al layer, and another Ti layer. As described above, some of the first source electrode SE1, the first drain electrode DE1, the second source electrode SE2, and the second drain electrode DE2 may be omitted or replaced with other configurations.

A planarization layer 119 may be arranged on the fourth insulating layer 118. The planarization layer 119 may have a single-layer or multi-layer structure. The planarization layer 119 may have an upper surface planarized through chemical and/or mechanical polishing.

The planarization layer 119 may include an organic insulating material such as a general-purpose polymer such as photosensitive polyimide, polyimide, polystyrene (PS), polycarbonate (PC), benzocyclobutene (BCB), hexamethyldisiloxane (HMDSO), and poly(methyl methacrylate) (PMMA), a polymer derivative having a phenol-based group, an acryl-based polymer, an amide-based polymer, an aryl ether-based polymer, an amide-based polymer, a fluorine-based polymer, a p-xylene-based polymer, or a vinyl alcohol-based polymer.

The display element layer DEL including the organic light-emitting diode OLED may be arranged on the planarization layer 119.

A pixel electrode 210 may be arranged on the planarization layer 119. The pixel electrode 210 may include a reflective layer including silver (Ag), magnesium (Mg), Al, platinum (Pt), palladium (Pd), gold (Au), nickel (Ni), neodymium (Nd), Ir, Cr, or any compounds thereof. The pixel electrode 210 may include a transparent conductive layer arranged above or/and below the reflective layer. The transparent conductive layer may include indium tin oxide (ITO), indium zinc oxide (IZO), ZnO, indium oxide ($In_2O_3$), indium gallium oxide (IGO), or aluminum zinc oxide (AZO). In an embodiment, the pixel electrode 210 may have a three-layer structure of sequentially stacked ITO layer/Ag layer/ITO layer.

A pixel-defining layer 121 may cover an edge of the pixel electrode 210 and may include an opening 121OP exposing a center of the pixel electrode 210. The pixel-defining layer 121 may include an organic insulating material such as BCB, polyimide, or HMDSO. An emission area EA may be defined by the opening 121OP of the pixel-defining layer 121, and red, green, or blue light may emit through the emission area EA. An area or width of the emission area EA may define an area or width of a pixel.

The pixel-defining layer 121 may be provided in black. The pixel-defining layer 121 may include a light-blocking material and may be provided in black. The light-blocking material may include carbon black, carbon nanotubes, a resin or paste containing black dye, metal particles such as Ni, Al, Mo, and alloys thereof, metal oxide particles (e.g., a chromium oxide), or metal nitride particles (e.g., a chromium nitride). In case that the pixel-defining layer 121 includes a light-blocking material, external reflection by the metal structures arranged under the pixel-defining layer 121 may be reduced.

A spacer 123 may be provided on the pixel-defining layer 121. The spacer 123 may prevent damage to layers under the spacer 123 by a mask in a process of forming an intermediate layer 220, which is described below. In an embodiment, the spacer 123 may include the same material as the pixel-defining layer 121 or may include a different material from that of the pixel-defining layer 121. For example, in case that the spacer 123 includes the same material as the pixel-defining layer 121, the spacer 123 and the pixel-defining layer 121 may be integrally formed as a single body by a half-tone mask. In case that the pixel-defining layer 121 is provided in black, the spacer 123 may also be provided in black.

A conductive pattern 124 may be arranged on the spacer 123. In an embodiment, the conductive pattern 124 may improve conductivity of a material included in the spacer 123. In an embodiment, a portion of the spacer 123 may be modified by injecting a doping material into an upper surface of the spacer 123 to form the conductive pattern 124. In an embodiment, the conductive pattern 124 may extend from the spacer 123 to a partial area of the pixel-defining layer 121.

For example, the conductive pattern 124 may include any one or more doping materials selected from the group including a halogen element and a chalcogen element. In case that an organic material included in the spacer 123 is doped with any one or more doping materials selected from the group including a halogen element and a chalcogen element, the number of carbon bonds in the organic material may increase to improve conductivity. In an embodiment, the doping material may include any one or more elements of boron (B), fluorine (F), and phosphorus (P).

A concentration distribution of the doping material of the conductive pattern 124 may change along a first direction perpendicular to an upper surface of the substrate 100. In an embodiment, a concentration of the doping material may be highest on an upper surface of the conductive pattern 124, and the concentration of the doping material may decrease rapidly as reaching to the upper surface of the pixel-defining layer 121. In another embodiment, in the conductive pattern 124, the concentration of the doping material may be highest in an area having a certain depth from the upper surface of the spacer 123. Accordingly, by adjusting the concentration of the doping material according to the depth, an effect of the conductive pattern 124 on the organic light-emitting diode OLED may be minimized while reducing a generation of static electricity in a manufacturing process.

A fine metal mask used during the manufacturing process may come into contact with the spacer 123 or/and the pixel-defining layer 121 to generate static electricity. The generated static electricity may accumulate fixed charges in the organic light-emitting diode OLED, and thus a display quality of the display apparatus 1 (see FIG. 1) may be deteriorated. The conductive pattern 124 provided on the upper surface of the spacer 123 may suppress the generation of static electricity during the manufacturing process, thereby improving the display quality of the display apparatus 1.

The intermediate layer 220 may include an emission layer 222 overlapping the pixel electrode 210. The emission layer 222 may include an organic material. The emission layer 222 may include a polymer organic material or a low-molecular weight organic material that emits light of a color. The emission layer 222 may be provided by a deposition process using a mask as described above.

A first functional layer 221 and a second functional layer 223 may be arranged below and/or above the emission layer 222, respectively. In an embodiment, unlike the emission layer 222 being patterned for each pixel, the first functional layer 221 and the second functional layer 223 may be integrally provided as a single body over the entire display area.

The first functional layer 221 may include a single layer or multiple layers. For example, in case that the first functional layer 221 includes a polymer material, the first functional layer 221 may include poly(3,4-ethylenedihydroxythiophene) (PEDOT) or polyaniline (PANI) as a single-layered hole transport layer (HTL). In case that the first functional layer 221 includes a low molecular material, the first functional layer 221 may include a hole injection layer (HIL) and an HTL.

The first functional layer 221 and/or the second functional layer 223 may be selectively arranged. For example, in case that the first functional layer 221 and the emission layer 222 each include a polymer material, the second functional layer 223 may be provided. The second functional layer 223 may include a single layer or multiple layers. The second functional layer 223 may include an electron transport layer (ETL) and/or an electron injection layer (EIL).

An opposite electrode 230 may include a conductive material having a relatively low work function. For example, the opposite electrode 230 may include a (semi-)transparent layer including Ag, Mg, Al, Ni, Cr, lithium (Li), calcium (Ca), or any alloys thereof. In some embodiments, the opposite electrode 230 may include a layer including ITO, IZO, ZnO, or $In_2O_3$, on the (semi-)transparent layer including the materials described above. In an embodiment, the opposite electrode 230 may include Ag and Mg.

A sequentially stacked structure of the pixel electrode 210, the intermediate layer 220, and the opposite electrode 230 may constitute the organic light-emitting diode OLED. Although not shown in the drawings, the display layer DU may include an encapsulation layer for sealing the display element layer DEL. In an embodiment, the encapsulation layer may have a multi-layer structure including at least one inorganic insulating layer and at least one organic insulating layer. In another embodiment, the encapsulation layer may include a sealing substrate (e.g., a glass substrate, etc.) bonded to the substrate 100 by a sealant or frit.

FIGS. 6A to 6D are enlarged schematic diagrams illustrating a portion of a display panel according to embodiments.

FIGS. 6A to 6D are enlarged views illustrating region B of FIG. 4 in order to illustrate various embodiments of a conductive pattern arranged on the upper surface of the spacer 123. In FIGS. 6A to 6D, the same reference numerals or characters as those of FIG. 4 denote the same element, and redundant descriptions thereof are omitted.

Figure 6A:
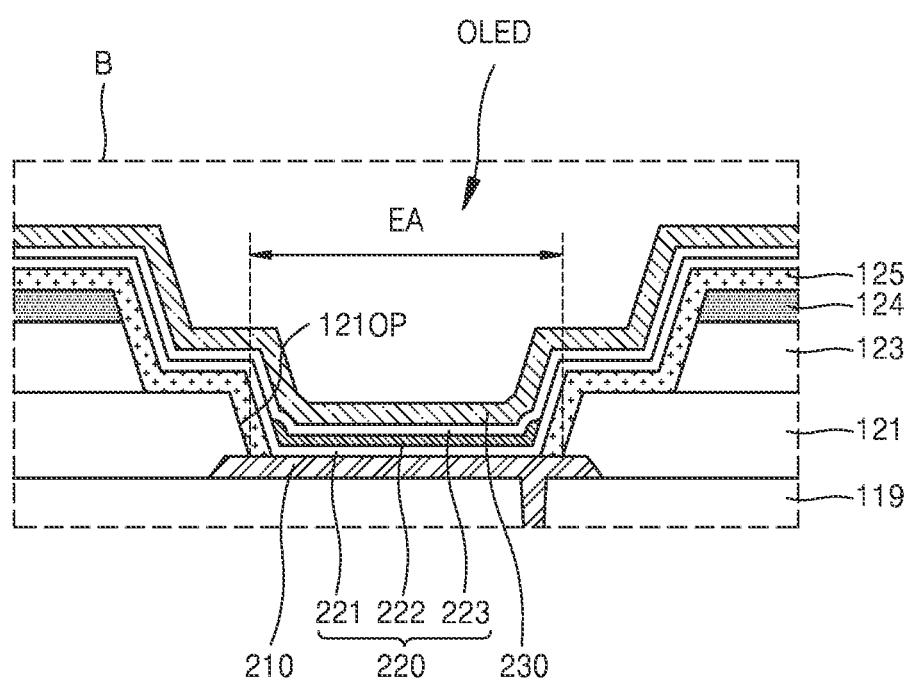
FIGS. 6A to 6E are enlarged schematic diagrams illustrating a portion of a display panel according to embodiments.

Referring to FIG. 6A, an inorganic layer 125 may be arranged between the conductive pattern 124 and the intermediate layer 220. In an embodiment, the inorganic layer 125 may extend from an upper portion of the spacer 123 and be arranged on at least a partial area of the pixel-defining layer 121. In another embodiment, the inorganic layer 125 may be arranged only on the upper surface of the spacer 123. The inorganic layer 125 may have an opening overlapping the opening 121OP of the pixel-defining layer 121. Accordingly, a portion of the pixel electrode 210 may be exposed through the opening of the inorganic layer 125.

The inorganic layer 125 may include an inorganic insulating material such as $SiO_x$, SiON, and $SiN_x$. The inorganic layer 125 may reduce an influence of impurities generated by forming the conductive pattern 124 by injecting a doping material into the spacer 123 from affecting the intermediate layer 220.

Figure 6B:
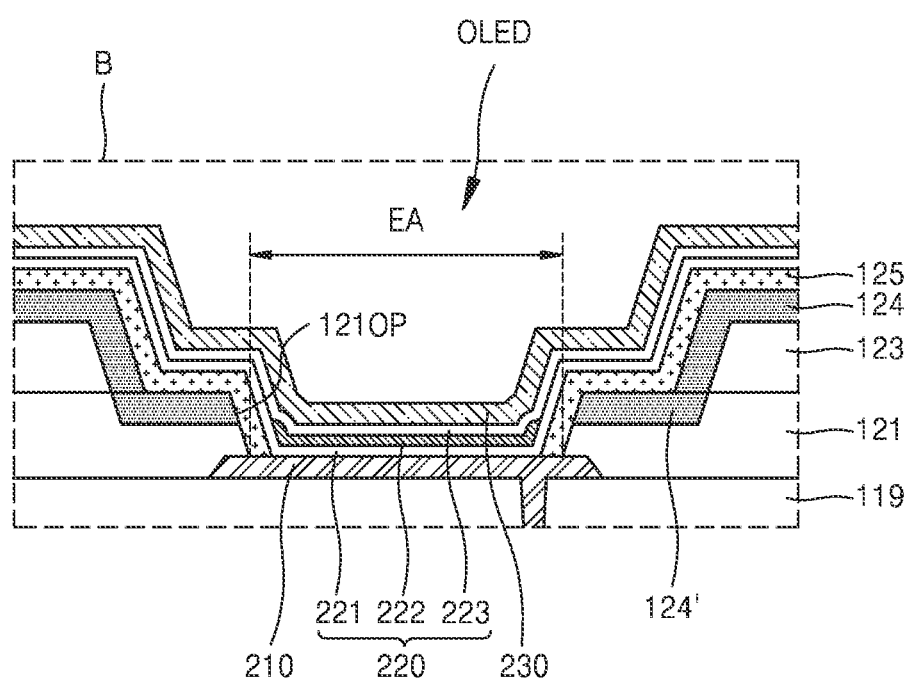

Referring to FIG. 6B, the conductive pattern 124 may include an extension pattern 124' extending from the spacer 123 to a partial area of the pixel-defining layer 121. As described above, in some embodiments, the pixel-defining layer 121 and the spacer 123 may include the same material and may be integrally provided as a single body. The conductive pattern 124 and the extension pattern 124' may be integrally provided as a single body.

Similar to the conductive pattern 124, the concentration of the doping material may change in the extension pattern 124' in the first direction perpendicular to an upper surface of the substrate 100. Accordingly, the effect of the conductive pattern 124 on the organic light-emitting diode OLED may be controlled while suppressing the generation of static electricity during the fine metal mask process.

Figure 6C:
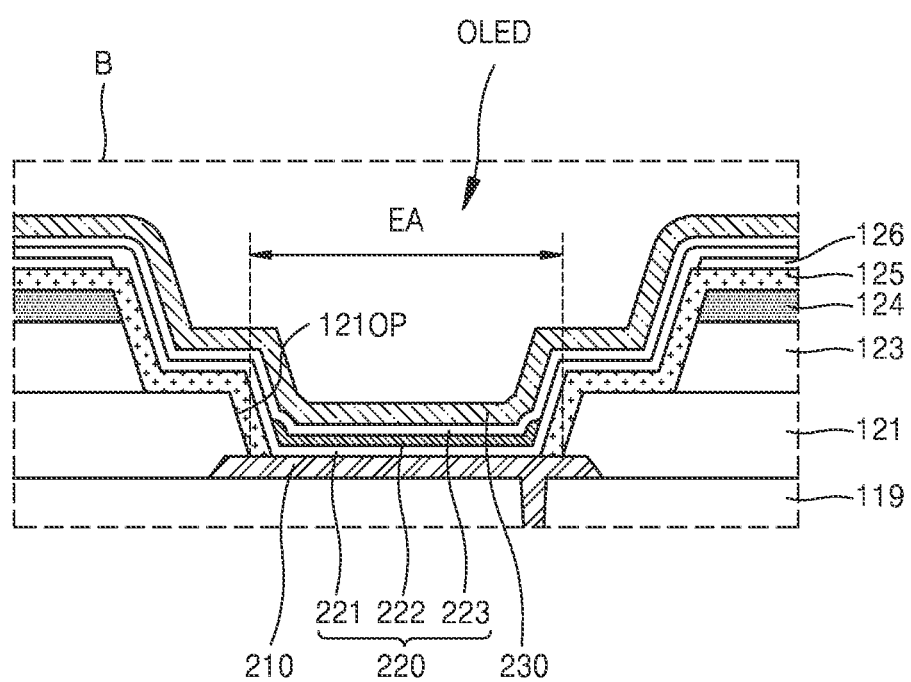

Referring to FIG. 6C, a coating layer 126 may be arranged on the spacer 123. The coating layer 126 may include an excessive amount of a doping material, and may be a layer for forming the conductive pattern 124 by supplying the doping material to the spacer 123 in a diffusion process. For example, the coating layer 126 may include a degenerate semiconductor layer. In an embodiment, the coating layer 126 may include an n+Si layer. In some embodiments, in case that the coating layer 126 is arranged on the inorganic layer 125, a second inorganic layer (not shown) arranged between the coating layer 126 and the inorganic layer 125 to cover the coating layer 126 may be arranged.

Figure 6D:
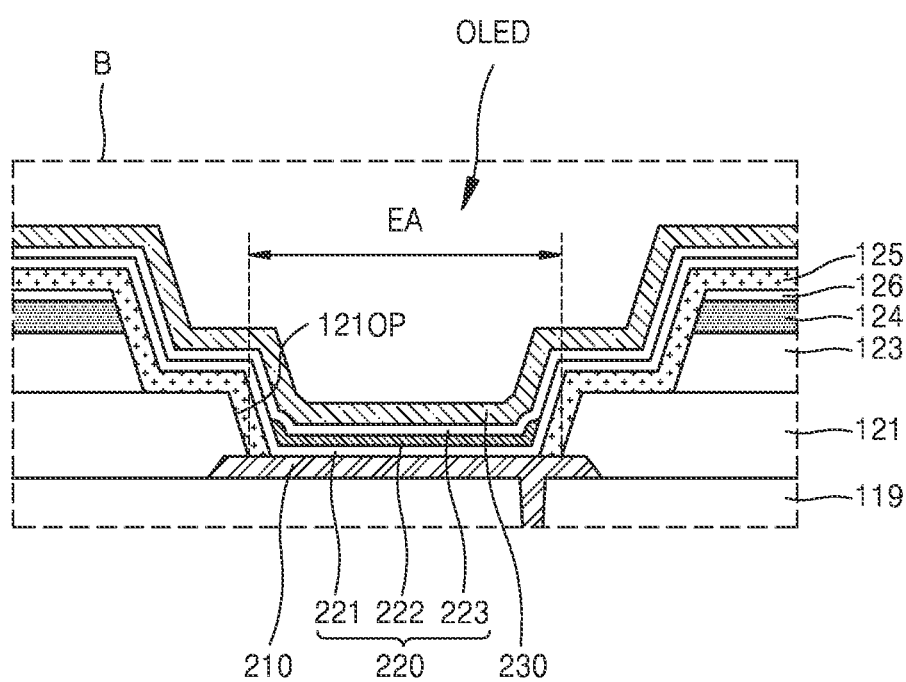

In FIG. 6C, the coating layer 126 is provided on the inorganic layer 125. However, as shown in FIG. 6D, the coating layer 126 may be arranged between the spacer 123 and the inorganic layer 125.

Figure 6E:
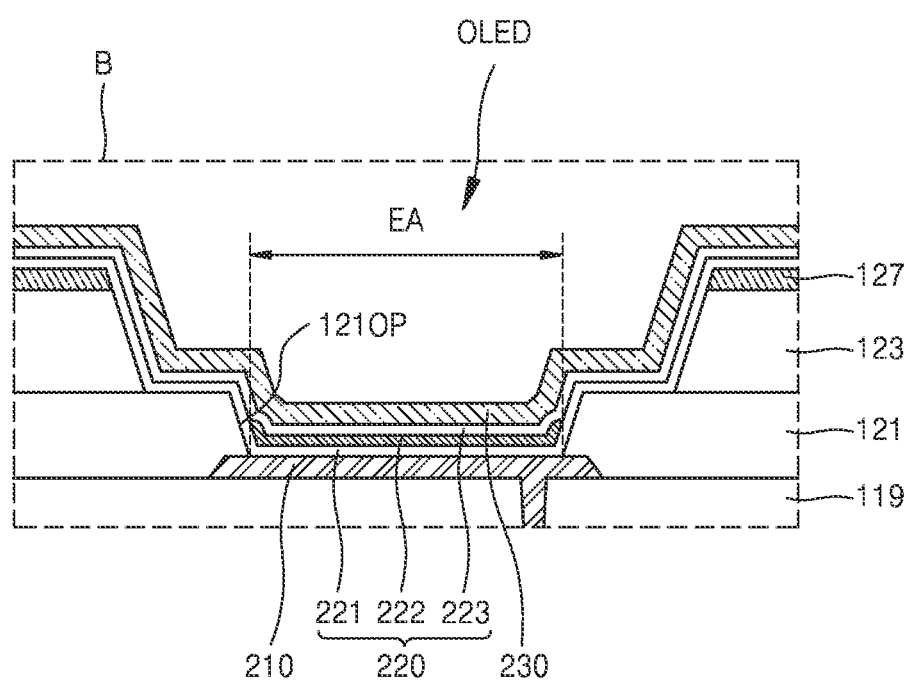

Referring to FIG. 6E, a conductive pattern 127 may be provided by stacking a conductive material on the spacer 123 without modifying a partial area of the spacer 123. The conductive pattern 127 may be patterned and arranged to overlap the spacer 123. For example, the conductive pattern 127 may be arranged only in an area overlapping the upper surface of the spacer 123.

In an embodiment, the conductive pattern 127 may include a metal material. In an embodiment, the metal material may be any one or more of Mo, Al, and Ag. The conductive pattern 127 may have a single-layer structure or a multi-layer structure including the above-described metal materials. In another embodiment, the conductive pattern 127 may include a conductive polymer material.

FIGS. 7A to 7D are schematic cross-sectional views schematically illustrating a method of manufacturing a display apparatus, according to an embodiment.

Figure 7A:
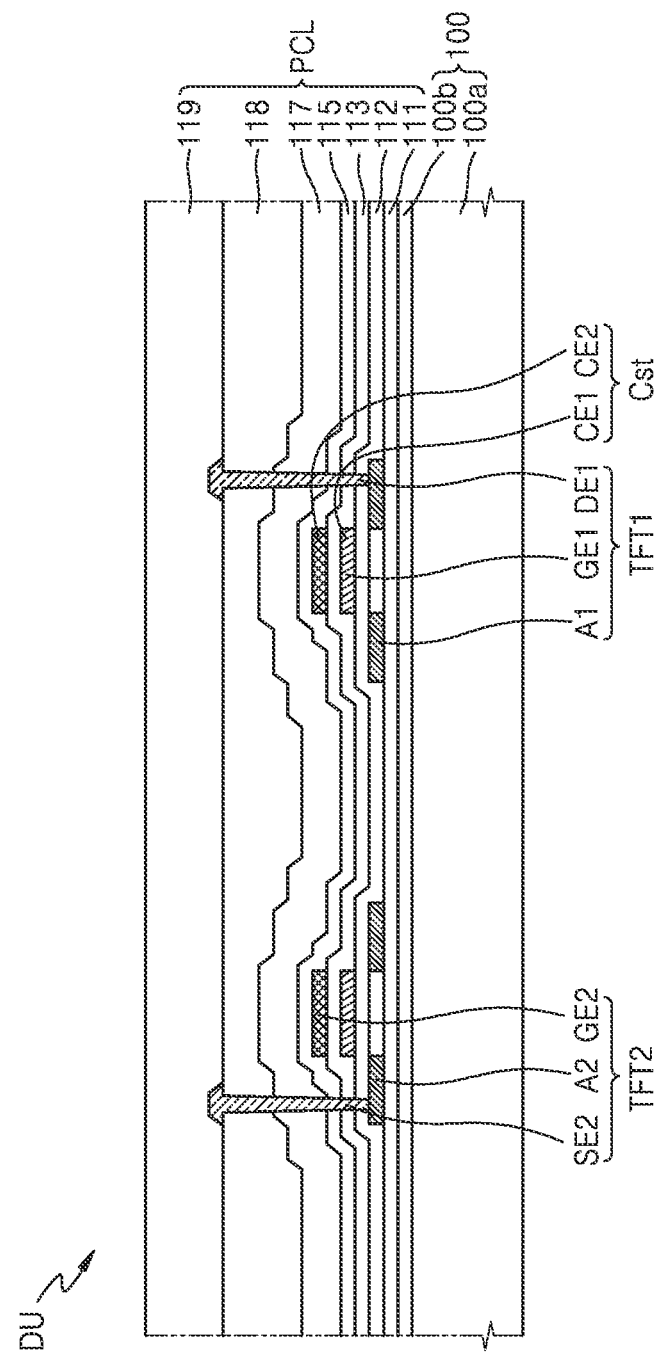
FIGS. 7A to 7D are schematic cross-sectional views schematically illustrating a method of manufacturing a display apparatus, according to an embodiment.

Referring to FIG. 7A, the pixel circuit layer PCL may be provided on the substrate 100.

The substrate 100 may have a multi-layer structure. For example, the substrate 100 may include an organic layer 100a and a barrier layer 100b including an inorganic material arranged on the organic layer 100a. The buffer layer 111 may be provided on the substrate 100. The buffer layer 111 may prevent impurities from entering various elements arranged on the substrate 100 through the substrate 100.

The first semiconductor layer A1 and the second semiconductor layer A2 may be provided on the buffer layer 111. The first semiconductor layer A1 and the second semiconductor layer A2 may include a silicon semiconductor material or an oxide semiconductor material. In an embodiment, the first semiconductor layer A1 and the second semiconductor layer A2 may be integrally provided as a single body. In another embodiment, as shown in FIG. 4, the first semiconductor layer A1 and the second semiconductor layer A2 may be arranged on different layers.

The gate insulating layer 112 may be provided on the first semiconductor layer A1 and the second semiconductor layer A2. The first gate electrode GE1 and the second gate electrode GE2 may be provided on the gate insulating layer 112. The first gate electrode GE1 may be arranged to overlap the channel area of the first semiconductor layer A1, and the second gate electrode GE2 may be arranged to overlap the channel area of the second semiconductor layer A2. The first insulating layer 113 may be provided on the first gate electrode GE1 and the second gate electrode GE2. The second capacitor plate CE2 overlapping the first gate electrode GE1 may be provided on the first insulating layer 113. The first gate electrode GE1 may function as the first capacitor plate CE1, and the first capacitor plate CE1 and the second capacitor plate CE2 may constitute the storage capacitor Cst. The second insulating layer 115 and the third insulating layer 117 may be sequentially provided to cover the second capacitor plate CE2. Any one of the second insulating layer 115 and the third insulating layer 117 may be omitted.

The second source electrode SE2 and the first drain electrode DE1 may be provided on the third insulating layer 117. In FIG. 7A, only the first drain electrode DE1 electrically connected to a drain area of the first thin-film transistor TFT1 and the second source electrode SE2 electrically connected to a source area of the second thin-film transistor TFT2 are shown. However, according to various designs, all of the first source electrode SE1, the first drain electrode DE1, the second source electrode SE2, and the second drain electrode DE2 may be included, or at least one of them may be omitted.

The planarization layer 119 may be provided on the third insulating layer 117 to cover the first drain electrode DE1 and the second source electrode SE2. The planarization layer 119 may include an organic insulating material and may have an upper surface planarized by chemical and/or mechanical polishing.

Figure 7B:
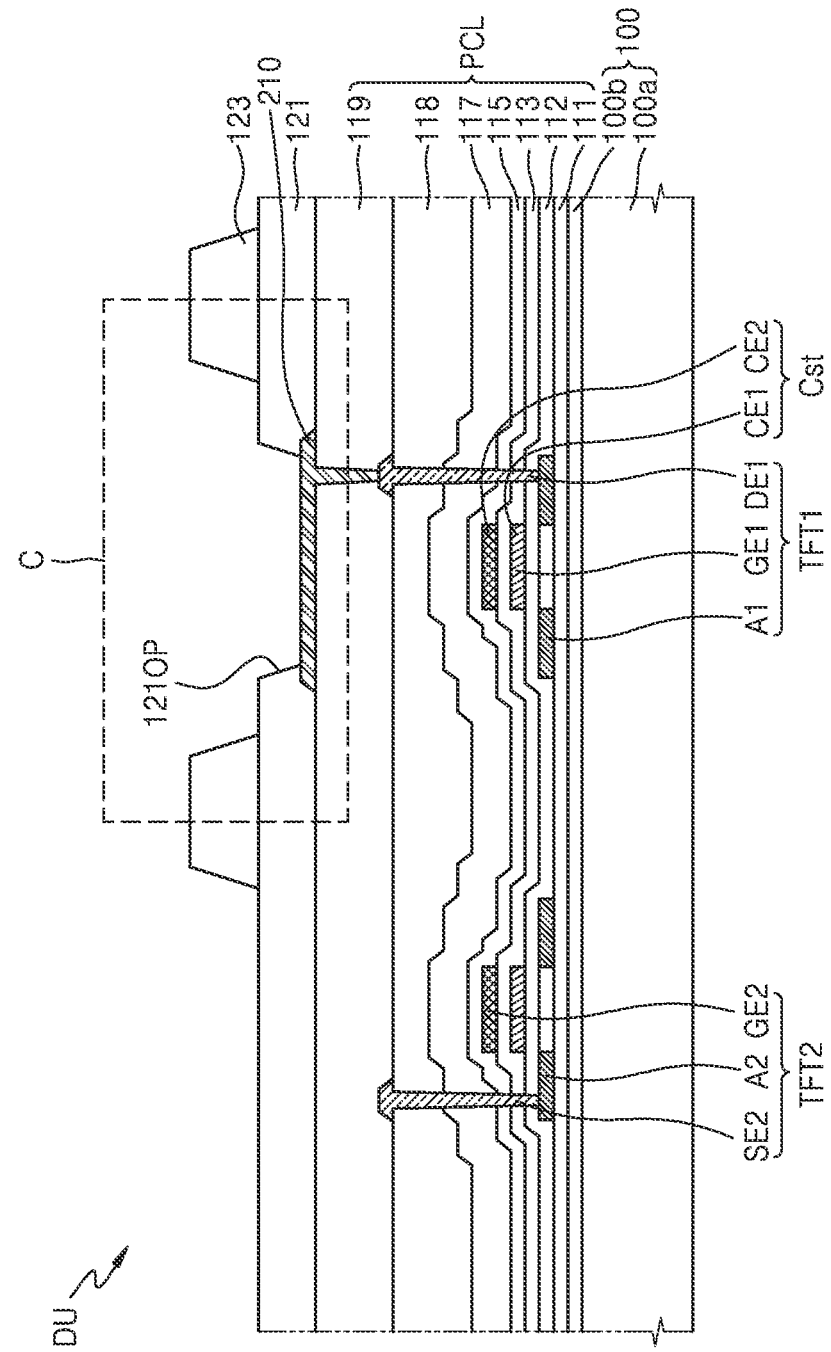

Referring to FIG. 7B, the pixel electrode 210 may be provided on the planarization layer 119. The pixel-defining layer 121 may be provided on the planarization layer 119 to cover an edge of the pixel electrode 210. For example, the pixel-defining layer 121 may include an opening 2120P exposing the center of the pixel electrode 210.

The pixel-defining layer 121 may include an organic insulating material such as BCB, polyimide, or HMDSO. An emission area EA may be defined by the opening 121OP of the pixel-defining layer 121, and red, green, or blue light may emit through the emission area EA. An area or width of the emission area EA may define an area or width of a pixel.

The spacer 123 may be provided on the pixel-defining layer 121. The spacer 123 may be to prevent damage to the layers under the spacer 123 by a mask in a process of forming the intermediate layer 220, and may be formed to protrude on the pixel-defining layer 121.

The spacer 123 may include the same material as the pixel-defining layer 121 or may include a different material. In an embodiment, in case that the spacer 123 includes the same material as the pixel-defining layer 121, the spacer 123 and the pixel-defining layer 121 may be integrally formed as a single body by a half-tone mask.

Figure 7C:
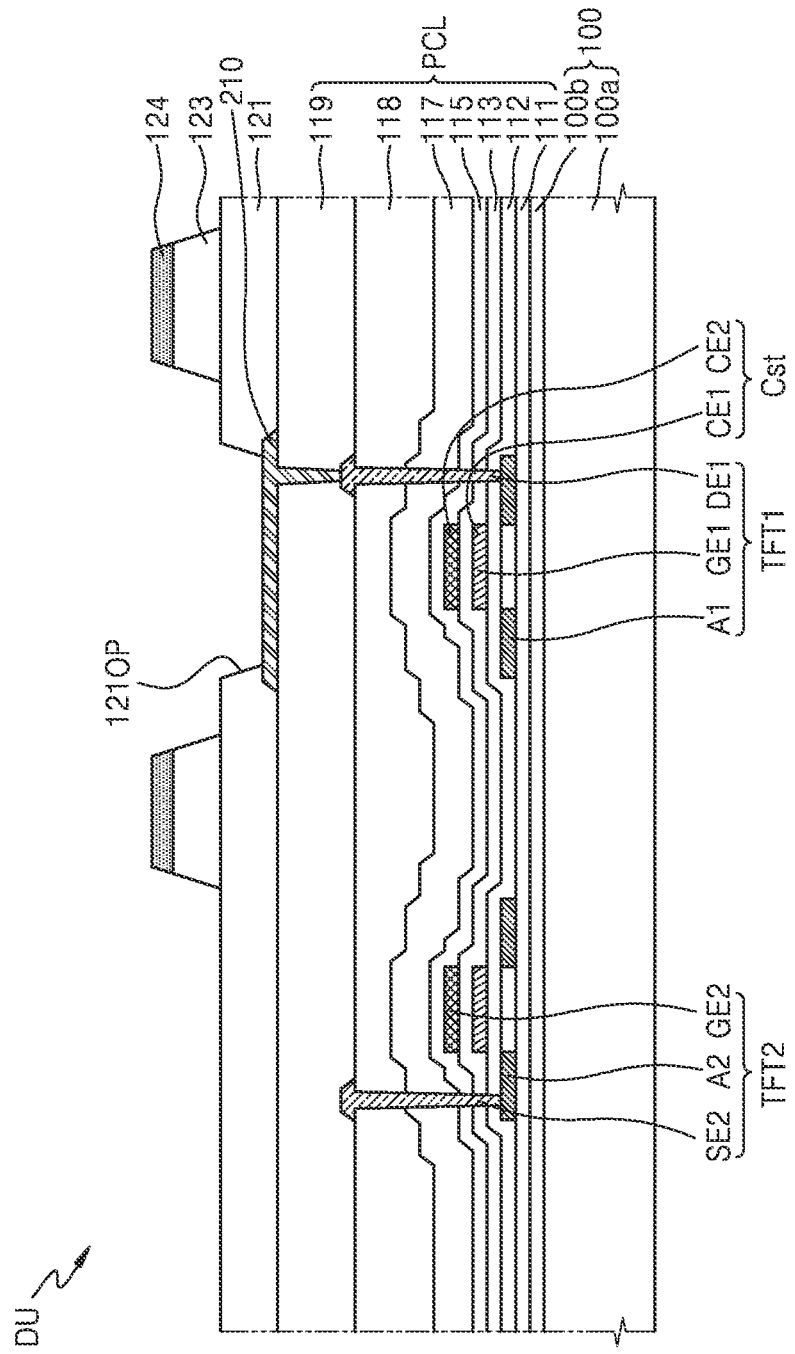

Referring to FIG. 7C, the conductive pattern 124 may be provided on the spacer 123. In an embodiment, the conductive pattern 124 may be provided by injecting a doping material into a partial area of the spacer 123 to improve conductivity. In an embodiment, the conductive pattern 124 may be provided by an ion implantation process. In another embodiment, the conductive pattern 124 may be provided by a diffusion process. For example, the conductive pattern 124 may include any one or more doping materials selected from the group consisting of a halogen element and a chalcogen element as an organic material forming the spacer 123. In an embodiment, the doping material may include any one of B, F, and P.

A concentration distribution of the doping material of the conductive pattern 124 may change along the first direction perpendicular to an upper surface of the substrate 100. For example, the concentration of the doping material may be highest on an upper surface of the conductive pattern 124, and the concentration of the doping material may decrease rapidly as reaching to the upper surface of the pixel-defining layer 121. In another embodiment, by controlling an energy applied in case that the doping material is injected, the concentration of the doping material may be easily adjusted according to the depth. For example, the concentration of the doping material at a preset depth of the conductive pattern 124 may be higher than the concentration of the doping material on the upper surface of the conductive pattern 124. Accordingly, the influence of the conductive pattern 124 on the organic light-emitting diode OLED may be minimized while reducing the generation of static electricity in the manufacturing process.

In FIG. 7C, the conductive pattern 124 is provided on an upper area of the spacer 123. However, in some embodiments, the conductive pattern 124 may be provided to extend to a partial area of the pixel-defining layer 121. For example, the doping material may be injected into the partial area of the pixel-defining layer 121 to form an extension pattern.

Figure 7D:
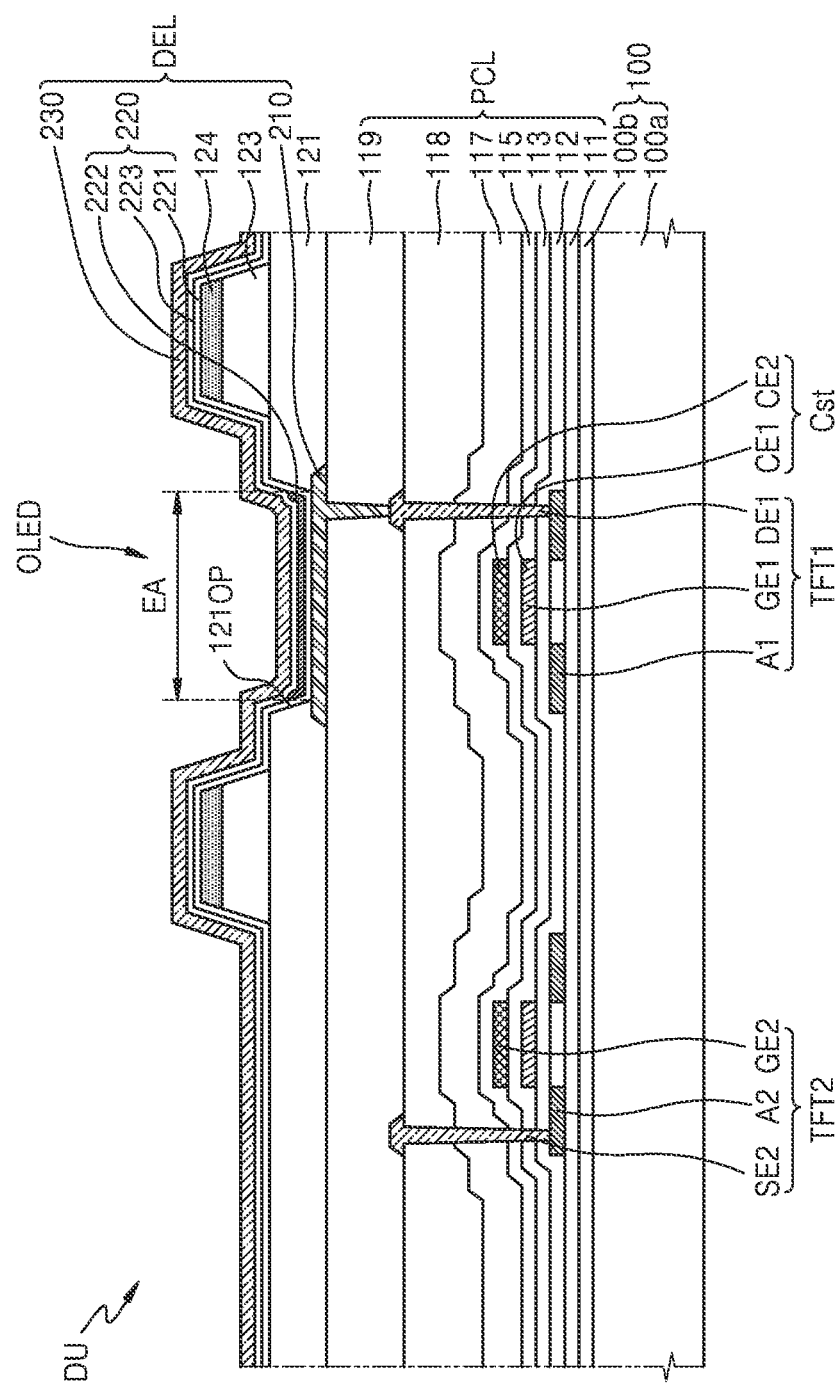

Referring to FIG. 7D, the intermediate layer 220 may be provided on the pixel-defining layer 121 and the spacer 123. The intermediate layer 220 may include the first functional layer 221, the emission layer 222, and the second functional layer 223. In an embodiment, the first functional layer 221 may be integrally provided over multiple pixels. The first functional layer 221 may include a single layer or multiple layers. For example, in case that the first functional layer 221 includes a polymer material, the first functional layer 221 may include PEDOT or PANI as a single layered HTL. In case that the first functional layer 221 includes a low molecular material, the first functional layer 221 may include an HIL and an HTL.

The emission layer 222 may be provided on the first functional layer 221. The emission layer 222 may be provided by a deposition process using a fine metal mask in order to be patterned and arranged for each pixel. The conductive pattern 124 may reduce static electricity generated due to contact between the spacer 123 and the fine metal mask, and may prevent accumulation of fixed charges in the emission layer 222.

The second functional layer 223 may be provided on the emission layer 222. The second functional layer 223 may include a single layer or multiple layers. The second functional layer 223 may include an ETL and/or an EIL. A step of forming the first functional layer 221 and/or the second functional layer 223 may be omitted.

The opposite electrode 230 may be provided on the intermediate layer 220. The opposite electrode 230 may include a conductive material having a relatively low work function. For example, the opposite electrode 230 may include a (semi-)transparent layer including Ag, Mg, Al, Ni, Cr, Li, Ca, or any alloys thereof. In some embodiments, the opposite electrode 230 may include a layer including ITO, IZO, ZnO, or $In_2O_3$, on the (semi-)transparent layer including the materials described above. In an embodiment, the opposite electrode 230 may include Ag and Mg.

A sequentially stacked structure of the pixel electrode 210, the intermediate layer 220, and the opposite electrode 230 may constitute the organic light-emitting diode OLED.

Figure 8A:
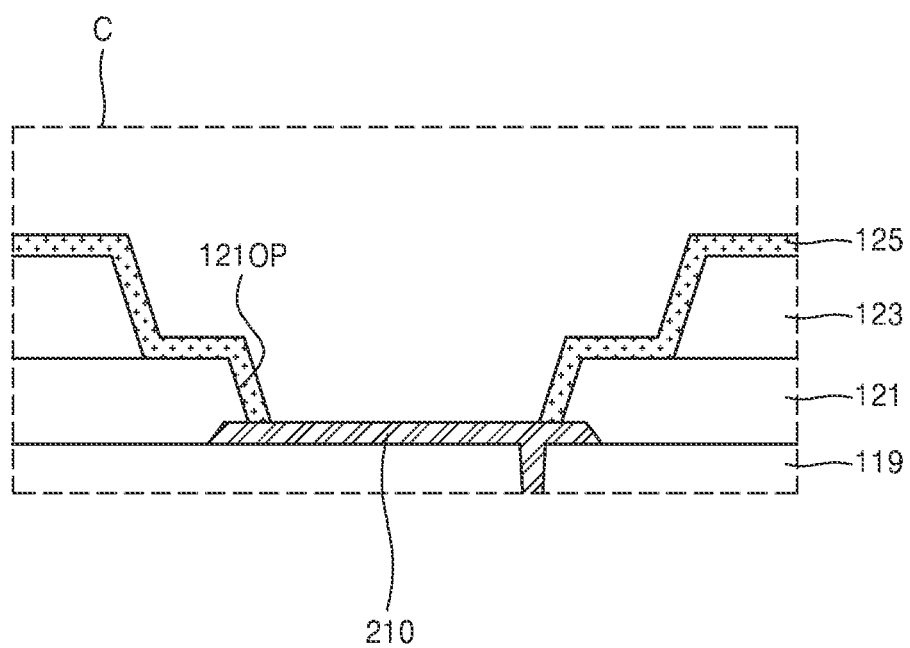
FIGS. 8A to 8C are schematic cross-sectional views schematically illustrating a method of manufacturing a display apparatus, according to an embodiment.
Figure 8B:
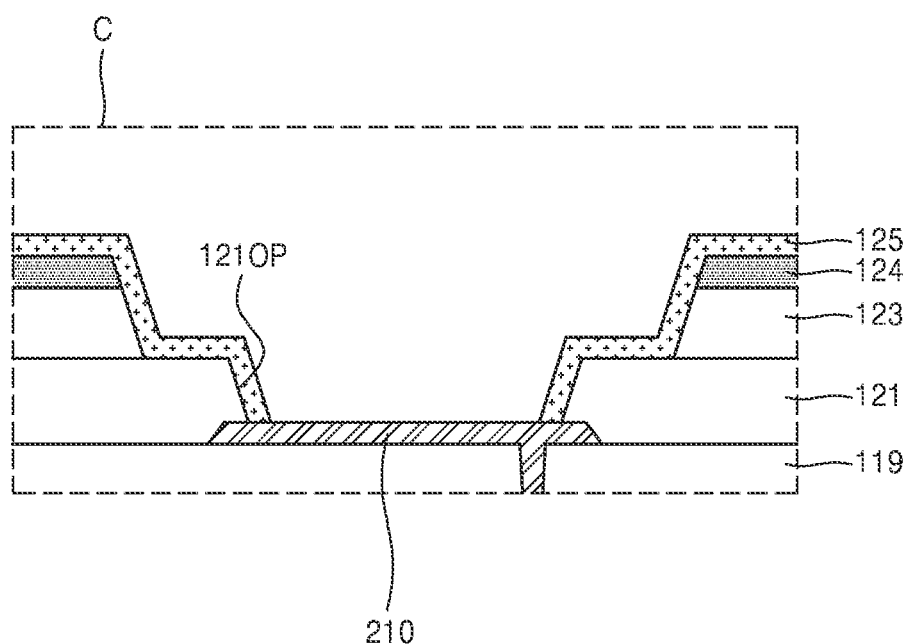

FIGS. 8A to 8B are schematic cross-sectional views schematically illustrating a method of manufacturing a display apparatus, according to an embodiment.

FIGS. 8A to 8B are enlarged views of region C of FIG. 7B to explain a method of indirectly forming the conductive pattern 124 by forming the inorganic layer 125.

Referring to FIG. 8A, the inorganic layer 125 may be provided on the spacer 123. In an embodiment, the inorganic layer 125 may cover the spacer 123 and may be arranged on at least a partial area of the pixel-defining layer 121. For example, the inorganic layer 125 may extend from the upper surface of the spacer 123 to cover a side surface of the opening 121OP of the pixel-defining layer 121.

The inorganic layer 125 may include an inorganic insulating material such as $SiO_x$, SiON, and $SiN_x$. In an embodiment, the inorganic layer 125 may be provided using a chemical vapor deposition. The inorganic layer 125 may reduce impurities generated by injecting a doping material into a portion of the spacer 123 and/or the pixel-defining layer 121 from affecting the intermediate layer 220.

Referring to FIG. 8B, a doping material may be injected into a partial area of the spacer 123 through the inorganic layer 125. In case that the doping material is injected into the spacer 123, an organic material included in the spacer 123 may generate gas. The inorganic layer 125 may minimize an effect on the intermediate layer 220 by suppressing the generation of gas, and maintain a vacuum degree of a chamber within a certain range during the manufacturing process. In FIGS. 8A and 8B, the inorganic layer 125 may be first provided and then the spacer 123 may be doped, but in another embodiment, the inorganic layer 125 may be provided after doping the spacer 123 first.

Figure 8C:
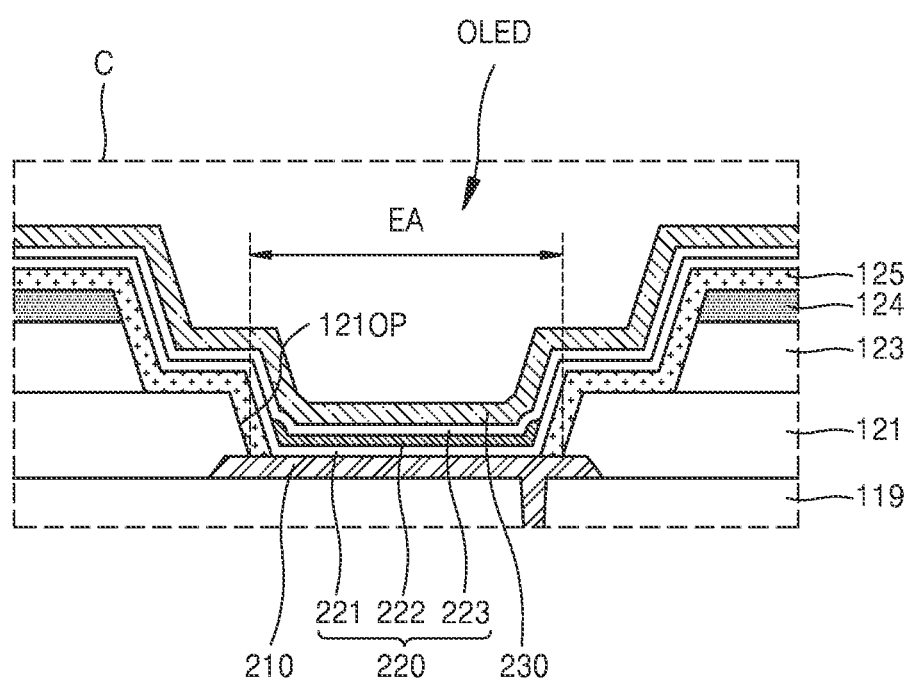

Referring to FIG. 8C, the intermediate layer 220 and the opposite electrode 230 may be sequentially provided on the inorganic layer 125. The inorganic layer 125 may be arranged between the conductive pattern 124 and the intermediate layer 220 to prevent the intermediate layer 220 from being contaminated by impurities generated in the conductive pattern 124.

Figure 9A:
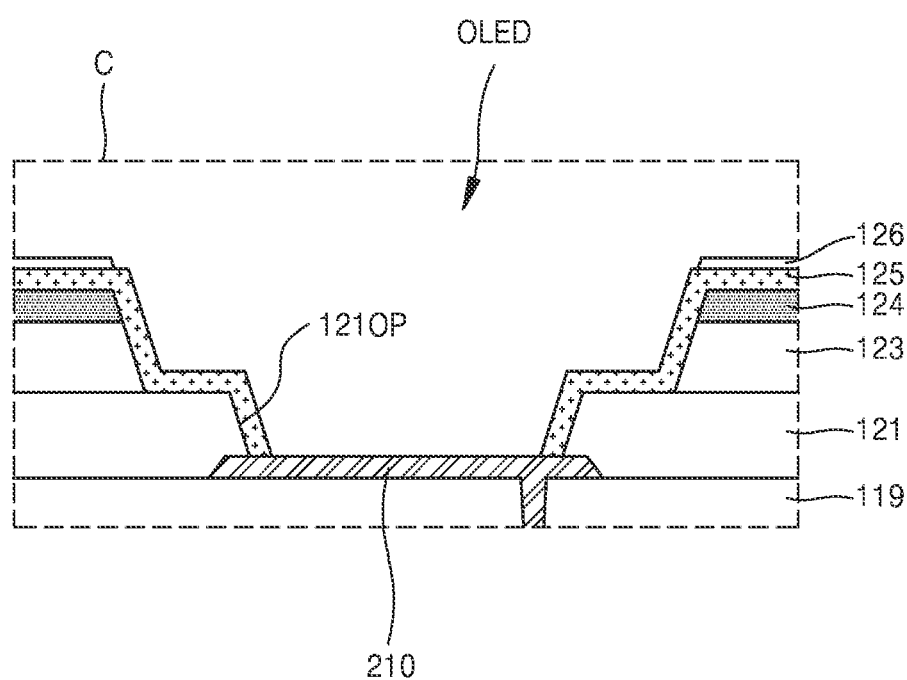
FIGS. 9A to 9B are schematic cross-sectional views schematically illustrating a method of manufacturing a display apparatus, according to an embodiment.
Figure 9B:
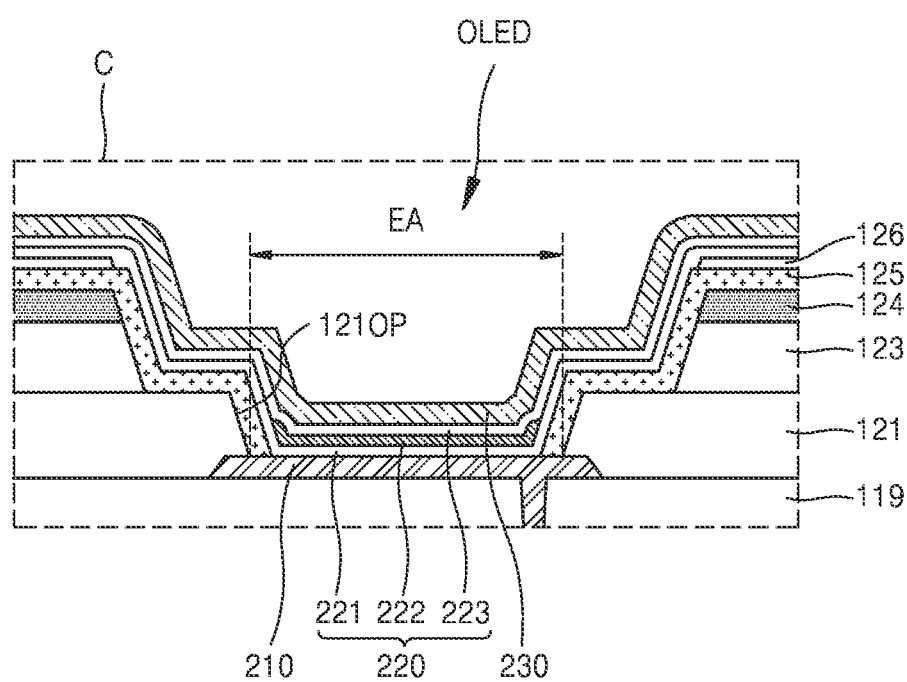

FIGS. 9A and 9B are schematic cross-sectional views schematically illustrating a method of manufacturing a display apparatus, according to an embodiment.

FIGS. 9A and 9B are enlarged views illustrating region C of FIG. 7B to describe a method of forming the coating layer 126 on the spacer 123 and injecting a doping material into the spacer 123 by using a diffusion method.

Referring to FIGS. 9A and 9B, the inorganic layer 125 may be provided on the spacer 123. In an embodiment, the coating layer 126 may be provided on the inorganic layer 125 to overlap a partial region of the spacer 123 and/or the pixel-defining layer 121. In another embodiment, the coating layer 126 may be provided to overlap only the upper surface of the spacer 123.

In FIG. 9A, the coating layer 126 is provided on the inorganic layer 125. However, in some embodiments, the coating layer 126 may be arranged between the spacer 123 and the inorganic layer 125. In some embodiments, the coating layer 126 may be provided to have a multi-layer structure in which the coating layer 126 is provided on the inorganic layer 125, and a second inorganic layer covering the coating layer 126 is further provided on the coating layer 126.

The coating layer 126 may include a degenerate semiconductor layer including an excess of doping material. In an embodiment, the doping material may include any one or more materials selected from the group consisting of a halogen element and a chalcogen element. In an embodiment, the coating layer 126 may include a silicon layer overdoped with any one or more elements of B, F, and P.

The intermediate layer 220 and the opposite electrode 230 may be sequentially provided on the coating layer 126.

Figure 10A:
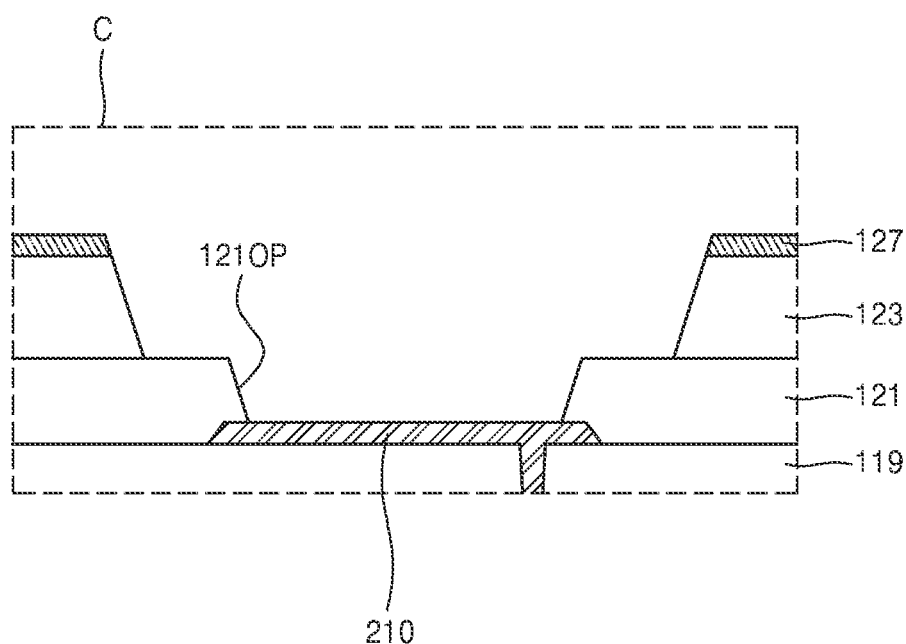
FIGS. 10A to 10B are schematic cross-sectional views schematically illustrating a method of manufacturing a display apparatus, according to an embodiment.
Figure 10B:
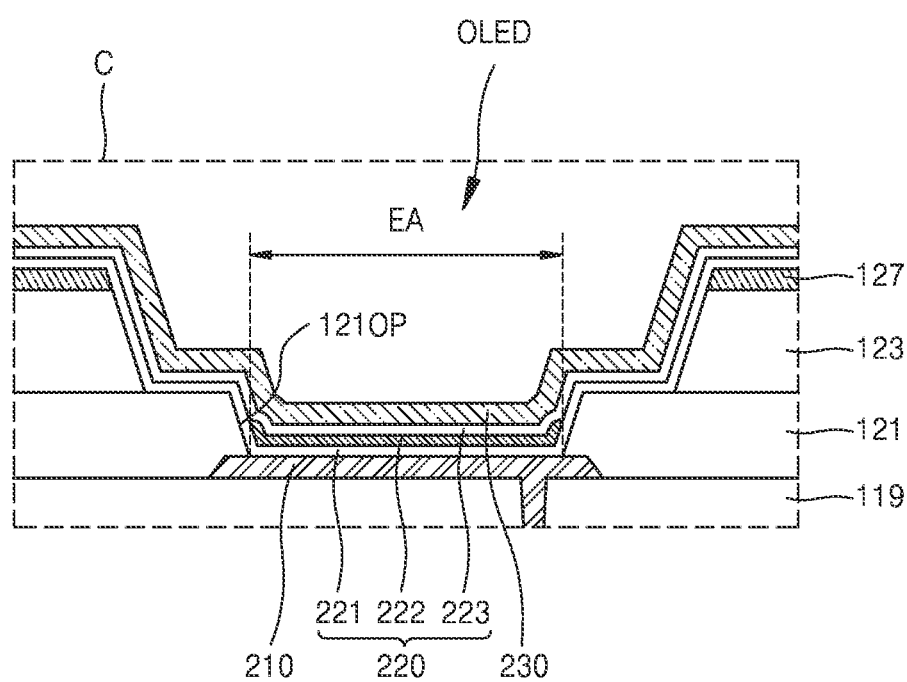

FIGS. 10A to 10B are schematic cross-sectional views schematically illustrating a method of manufacturing a display apparatus, according to an embodiment.

FIGS. 10A and 10B are schematic diagrams provided to explain a method of forming a conductive pattern by stacking a conductive material on the spacer 123 instead of doping the spacer 123.

Referring to FIG. 10A, the conductive pattern 127 may be patterned to overlap the spacer 123. For example, the conductive pattern 127 may be arranged only on an area overlapping the upper surface of the spacer 123. In an embodiment, the conductive pattern 127 may be arranged to overlap only a partial region of the upper surface of the spacer 123.

In an embodiment, the conductive pattern 127 may include a metal material. In an embodiment, the metal material may be any one or more of Mo, Al, and Ag. The conductive pattern 127 may have a single-layer structure or a multi-layer structure including the above-described metal materials. In another embodiment, the conductive pattern 127 may include a conductive polymer material.

Referring to FIG. 10B, the intermediate layer 220 and the opposite electrode 230 may be provided on the conductive pattern 127. In case that the spacer 123 is separately formed without modifying the spacer 123, the intermediate layer 220 and other components may be prevented from being affected by impurities generated in case that a doping material is injected into the spacer 123.

According to the embodiments of the disclosure, a display apparatus having improved display quality by reducing static electricity generated during a manufacturing process, and a method of manufacturing the display apparatus may be realized. However, the scope of the disclosure is not limited by this effect.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a pixel circuit layer arranged on a substrate; and
a display element layer arranged on the pixel circuit layer, wherein
the display element layer comprises:
a display element including a pixel electrode;
an intermediate layer arranged on the pixel electrode; and
an opposite electrode;
a pixel-defining layer having an opening that exposes a portion of the pixel electrode;
a spacer arranged on the pixel-defining layer; and
a conductive pattern arranged on the spacer, wherein
the conductive pattern comprises a same material as the spacer, and further comprises doping material.

2. The display apparatus of claim 1, wherein the doping material is selected from a group consisting of a halogen element, a chalcogen element, and a combination thereof.

3. The display apparatus of claim 2, wherein the doping material includes boron (B), fluorine (F), phosphorus (P), or a combination thereof.

4. The display apparatus of claim 2, wherein a concentration distribution of the doping material changes along a first direction perpendicular to the substrate.

5. The display apparatus of claim 1, further comprising an inorganic layer disposed between the conductive pattern and the intermediate layer.

6. The display apparatus of claim 5, further comprising a coating layer disposed on the inorganic layer, wherein
the coating layer includes at least one element selected from a group consisting of a halogen element, a chalcogen element, and a combination thereof.

7. The display apparatus of claim 5, further comprising a coating layer disposed between the spacer and the inorganic layer, wherein
the coating layer includes at least one element selected from a group consisting of a halogen element, a chalcogen element, and a combination thereof.

8. The display apparatus of claim 1, wherein the conductive pattern overlaps at least a partial area of the spacer and at least a partial area of the pixel-defining layer.

9. A display apparatus comprising:
a pixel circuit layer arranged on a substrate; and
a display element layer arranged on the pixel circuit layer, wherein
the display element layer comprises:
a display element including a pixel electrode;
an intermediate layer arranged on the pixel electrode; and
an opposite electrode;
a pixel-defining layer having an opening that exposes a portion of the pixel electrode;
a spacer arranged on the pixel-defining layer; and
a conductive pattern arranged on the spacer, wherein
the conductive pattern includes a metal material, and
at least a portion of the intermediate layer is disposed on and directly contacts the conductive pattern.

10. A method of manufacturing a display apparatus, the method comprising:
forming a pixel circuit layer on a substrate;
forming a pixel electrode on the pixel circuit layer;
forming a pixel-defining layer having an opening that exposes a portion of the pixel electrode;
forming a spacer on the pixel-defining layer;
forming a conductive pattern by doping the spacer; and
sequentially forming an intermediate layer and an opposite electrode on the spacer.

11. The method of claim 10, wherein the forming of the conductive pattern comprises injecting, into the spacer, doping material selected from a group consisting of a halogen element, a chalcogen element, and a combination thereof.

12. The method of claim 11, wherein the doping material includes boron (B), fluorine (F), phosphorus (P), or a combination thereof.

13. The method of claim 11, wherein a concentration distribution of the doping material changes along a first direction perpendicular to the substrate.

14. The method of claim 11, wherein the forming of the conductive pattern comprises forming an inorganic layer on at least a partial area of the spacer and at least a partial area of the pixel-defining layer.

15. The method of claim 14, wherein the forming of the conductive pattern comprises injecting the doping material through the inorganic layer.

16. The method of claim 14, wherein
the forming of the conductive pattern comprises forming a coating layer on the spacer before the forming of the inorganic layer, and
the coating layer includes a doping material.

17. The method of claim 14, wherein
the forming of the conductive pattern comprises forming a coating layer on the inorganic layer, and
the coating layer includes a doping material.

18. The display apparatus of claim 9, wherein the conductive pattern overlaps at least a partial area of the spacer and at least a partial area of the pixel-defining layer.

19. A method of manufacturing a display apparatus, the method comprising:
forming a pixel circuit layer on a substrate;
forming a pixel electrode on the pixel circuit layer;
forming a pixel-defining layer having an opening that exposes a portion of the pixel electrode;
forming a spacer on the pixel-defining layer;
forming a conductive pattern that overlaps an upper surface of the spacer; and
sequentially forming an intermediate layer and an opposite electrode on the spacer, wherein at least a portion of the intermediate layer is formed on and directly contacts the conductive pattern.

20. The method of claim 19, wherein the conductive pattern includes a metal material.

\* \* \* \* \*